(12) United States Patent
Ino

(10) Patent No.: US 6,288,657 B1
(45) Date of Patent: Sep. 11, 2001

(54) ENCODING APPARATUS AND METHOD, DECODING APPARATUS AND METHOD, AND DISTRIBUTION MEDIA

(75) Inventor: Hiroyuki Ino, Gunma (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/409,799

(22) Filed: Sep. 30, 1999

(30) Foreign Application Priority Data

Oct. 2, 1998 (JP) .................................................. 10-281086

(51) Int. Cl.[7] ...................................................... H03M 1/16
(52) U.S. Cl. .............................. 341/102; 341/59; 341/50; 341/58; 341/63; 341/95; 341/102; 341/67; 341/68; 341/69; 341/107; 341/106; 375/240; 375/241; 375/246; 375/250; 375/264; 375/286
(58) Field of Search .................................. 341/58, 59, 50, 341/63, 67, 68, 69, 95, 102, 106, 107

(56) References Cited

U.S. PATENT DOCUMENTS

| 4,549,167 | * 10/1985 | Kato et al. ............................. 340/347 |
| 4,573,034 | * 2/1986 | Schouhamer Immink .......... 340/347 |
| 5,477,222 | * 12/1995 | Kahlman et al. ...................... 341/95 |

FOREIGN PATENT DOCUMENTS 744 838   11/1996 (EP) .

OTHER PUBLICATIONS

Frederickson L J : "On The Shannon Capacoty of DC–And Nyquist –Free Codes", IEEE Transactions on Information Theory, US, IEEE Inc., New York, vol. 37, No. 3, May 1, 1991, pp. 918–923, XP000204262.
Patent Abstracts of Japan, vol. 1998, No. 11, Sep. 30, 1998 & JP 10 173536, Jun. 26, 1998.

* cited by examiner

Primary Examiner—Michael Tokar
Assistant Examiner—Lam T. Mai
(74) Attorney, Agent, or Firm—Frommer Lawrence & Haug LLP.; William S. Frommer

(57) ABSTRACT

The subtracter performs subtraction processing between a pointer outputted from the pointer register and code words candidate outputted from the code word count storing circuit, and in accordance with whether the result is negative or positive, determines the code words of input data words. Code word candidates stored in the code word count storing circuit are created according to a finite-state transition diagram stored in the state transition storing circuit. An encoder and a decoder are thus made compact and faster.

13 Claims, 16 Drawing Sheets

F I G. 2
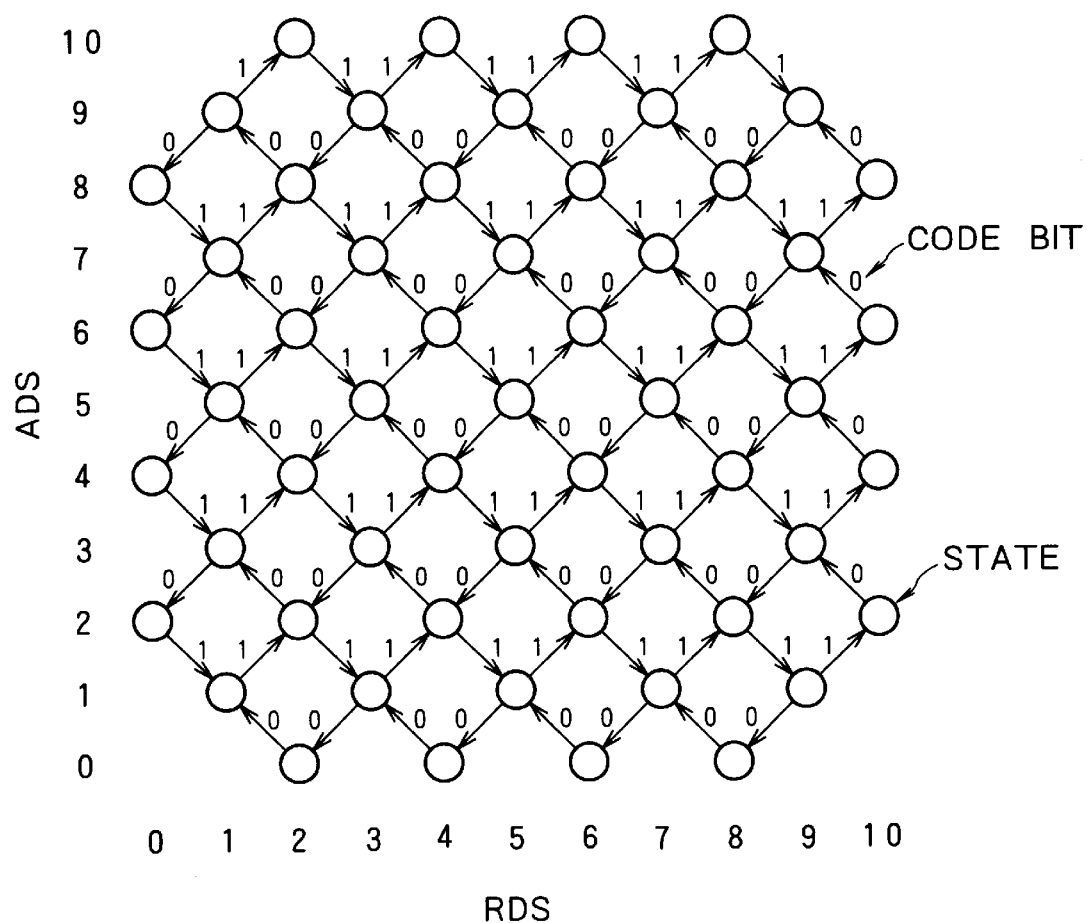

FIG. 5

| i | s = (ADS,RDS) | r (HEX) | i | s = (ADS,RDS) | r (HEX) |
|---|---|---|---|---|---|
| 8 | (1,1) | 0000 | 10 | (1,3) | 0018 |
| 8 | (1,5) | 0090 | 10 | (1,7) | 0030 |
| 8 | (1,9) | 0090 | 10 | (3,1) | 0018 |
| 8 | (3,3) | 0120 | 10 | (3,5) | 0078 |
| 8 | (3,7) | 01b0 | 10 | (3,9) | 0060 |
| 8 | (5,1) | 0090 | 10 | (5,3) | 0078 |
| 8 | (5,5) | 0240 | 10 | (5,7) | 00a8 |
| 8 | (5,9) | 01b0 | 10 | (7,1) | 0030 |
| 8 | (7,3) | 01b0 | 10 | (7,5) | 00a8 |
| 8 | (7,7) | 0240 | 10 | (7,9) | 0078 |
| 8 | (9,1) | 0090 | 10 | (9,3) | 0060 |
| 8 | (9,5) | 01b0 | 10 | (9,7) | 0078 |
| 8 | (9,9) | 0120 | 11 | (0,2) | 0018 |
| 9 | (0,4) | 0090 | 11 | (0,6) | 0030 |
| 9 | (0,8) | 0090 | 11 | (2,0) | 0000 |
| 9 | (2,2) | 0090 | 11 | (2,4) | 0048 |
| 9 | (2,6) | 0120 | 11 | (2,8) | 0048 |
| 9 | (2,10) | 0090 | 11 | (4,2) | 0030 |
| 9 | (4,0) | 0000 | 11 | (4,6) | 0060 |
| 9 | (4,4) | 0120 | 11 | (4,10) | 0030 |
| 9 | (4,8) | 0120 | 11 | (6,0) | 0000 |
| 9 | (6,2) | 0090 | 11 | (6,4) | 0048 |
| 9 | (6,6) | 0120 | 11 | (6,8) | 0048 |
| 9 | (6,10) | 0090 | 11 | (8,2) | 0018 |
| 9 | (8,0) | 0000 | 11 | (8,6) | 0030 |
| 9 | (8,4) | 0090 | 11 | (8,10) | 0018 |
| 9 | (8,8) | 0090 | 11 | (10,4) | 0000 |
| 9 | (10,2) | 0000 | 11 | (10,8) | 0000 |
| 9 | (10,6) | 0000 | | | |

FIG. 6

| s | ns | | s | ns | |
|---|---|---|---|---|---|
| | yi = 0 | yi = 1 | | yi = 0 | yi = 1 |
| (1,1) | | (2,2) | (1,3) | (0,2) | (2,4) |
| (1,5) | (0,4) | (2,6) | (1,7) | (0,6) | (2,8) |
| (1,9) | (0,8) | (2,10) | (3,1) | (2,0) | (4,2) |
| (3,3) | (2,2) | (4,4) | (3,5) | (2,4) | (4,6) |
| (3,7) | (2,6) | (4,8) | (3,9) | (2,8) | (4,10) |
| (5,1) | (4,0) | (6,2) | (5,3) | (4,2) | (6,4) |
| (5,5) | (4,4) | (6,6) | (5,7) | (4,6) | (6,8) |
| (5,9) | (4,8) | (6,10) | (7,1) | (6,0) | (8,2) |
| (7,3) | (6,2) | (8,4) | (7,5) | (6,4) | (8,6) |
| (7,7) | (6,6) | (8,8) | (7,9) | (6,8) | (8,10) |
| (9,1) | (8,0) | (10,2) | (9,3) | (8,2) | (10,4) |
| (9,5) | (8,4) | (10,6) | (9,7) | (8,6) | (10,8) |
| (9,9) | (8,8) | | (0,2) | (1,1) | |
| (0,4) | (1,3) | | (0,6) | (1,5) | |
| (0,8) | (1,7) | | (2,0) | | (1,1) |
| (2,2) | (3,1) | (1,3) | (2,4) | (3,3) | (1,5) |
| (2,6) | (3,5) | (1,7) | (2,8) | (3,7) | (1,9) |
| (2,10) | (3,9) | | (4,2) | (5,1) | (3,3) |
| (4,0) | | (3,1) | (4,6) | (5,5) | (3,7) |
| (4,4) | (5,3) | (3,5) | (4,10) | (5,9) | |
| (4,8) | (5,7) | (3,9) | (6,0) | | (5,1) |
| (6,2) | (7,1) | (5,3) | (6,4) | (7,3) | (5,5) |
| (6,6) | (7,5) | (5,7) | (6,8) | (7,7) | (5,9) |
| (6,10) | (7,9) | | (8,2) | (9,1) | (7,3) |
| (8,0) | | (7,1) | (8,6) | (9,5) | (7,7) |
| (8,4) | (9,3) | (7,5) | (8,10) | (9,9) | |
| (8,8) | (9,7) | (7,9) | (10,4) | | (9,5) |
| (10,2) | | (9,3) | (10,8) | | (9,9) |
| (10,6) | | (9,7) | | | |

F I G. 8
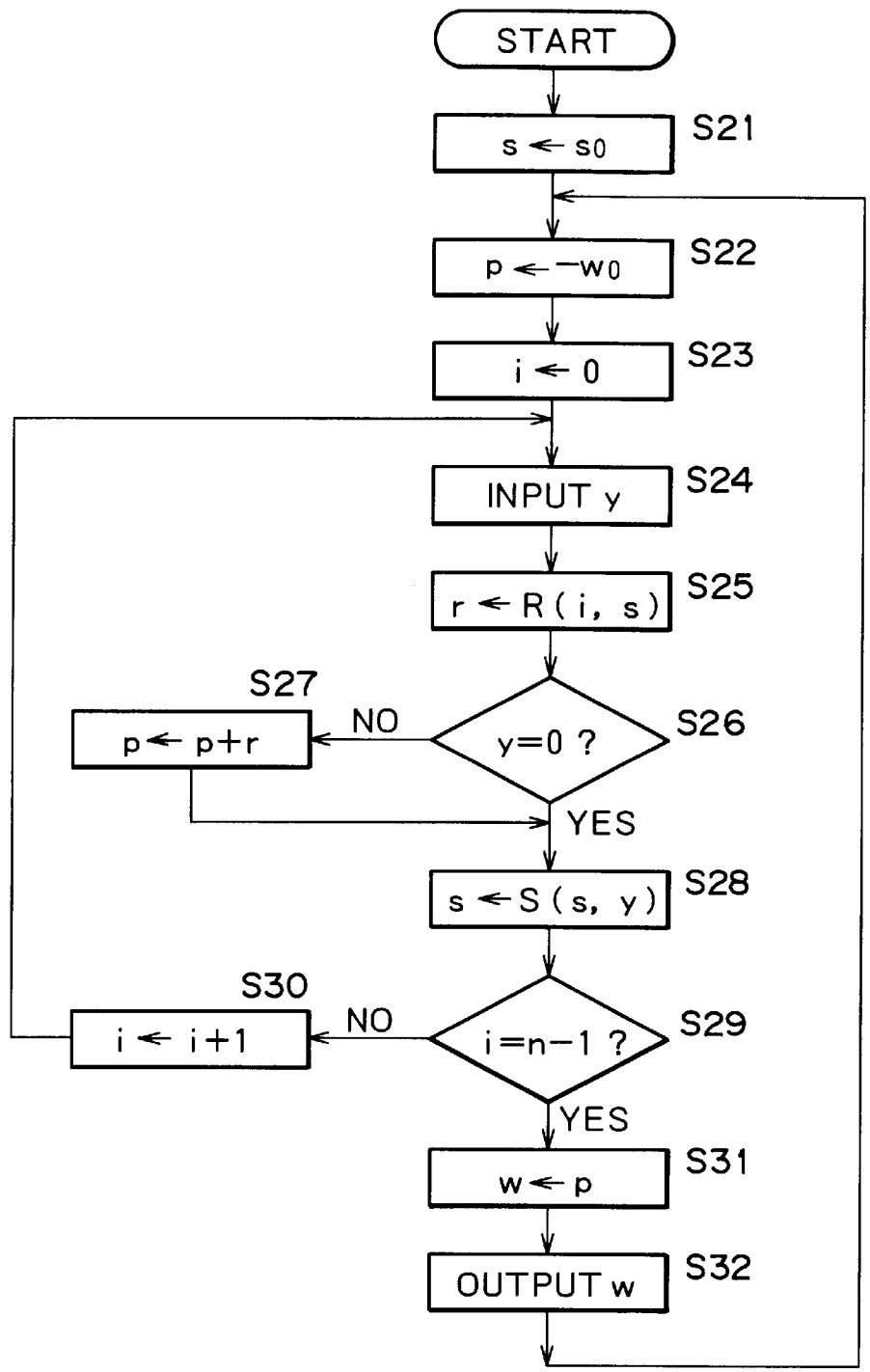

FIG. 11

| i | s (ADS,RDS) | nr (HEX) yi = 0 | yi = 1 | i | s (ASS,RDS) | nr (HEX) yi = 0 | yi = 1 |
|---|---|---|---|---|---|---|---|
| 8 | (1,1) |  | 0090 | 10 | (1,3) | 0018 | 0048 |
| 8 | (1,5) | 0090 | 0120 | 10 | (1,7) | 0030 | 0048 |
| 8 | (1,9) | 0090 | 0090 | 10 | (3,1) | 0000 | 0030 |
| 8 | (3,3) | 0090 | 0120 | 10 | (3,5) | 0048 | 0060 |
| 8 | (3,7) | 0120 | 0120 | 10 | (3,9) | 0048 | 0030 |
| 8 | (5,1) | 0000 | 0090 | 10 | (5,3) | 0030 | 0048 |
| 8 | (5,5) | 0120 | 0120 | 10 | (5,7) | 0060 | 0048 |
| 8 | (5,9) | 0120 | 0090 | 10 | (7,1) | 0000 | 0018 |
| 8 | (7,3) | 0090 | 0090 | 10 | (7,5) | 0048 | 0030 |
| 8 | (7,7) | 0120 | 0090 | 10 | (7,9) | 0048 | 0018 |
| 8 | (9,1) | 0000 | 0000 | 10 | (9,3) | 0018 | 0000 |
| 8 | (9,5) | 0090 | 0000 | 10 | (9,7) | 0030 | 0000 |
| 8 | (9,9) | 0090 |  | 11 | (0,2) | 0000 |  |
| 9 | (0,4) | 0018 |  | 11 | (0,6) | 000c |  |
| 9 | (0,8) | 0030 |  | 11 | (2,0) |  | 0000 |
| 9 | (2,2) | 0018 | 0018 | 11 | (2,4) | 0018 | 000c |
| 9 | (2,6) | 0078 | 0030 | 11 | (2,8) | 0024 | 000c |
| 9 | (2,10) | 0060 |  | 11 | (4,2) | 000c | 0018 |
| 9 | (4,0) |  | 0018 | 11 | (4,6) | 0030 | 0024 |
| 9 | (4,4) | 0078 | 0078 | 11 | (4,10) | 0024 |  |
| 9 | (4,8) | 00a8 | 0060 | 11 | (6,0) |  | 000c |
| 9 | (6,2) | 0030 | 0078 | 11 | (6,4) | 0024 | 0030 |
| 9 | (6,6) | 00a8 | 00a8 | 11 | (6,8) | 0030 | 0024 |
| 9 | (6,10) | 0078 |  | 11 | (8,2) | 000c | 0024 |
| 9 | (8,0) |  | 0030 | 11 | (8,6) | 0024 | 0030 |
| 9 | (8,4) | 0060 | 00a8 | 11 | (8,10) | 0018 |  |
| 9 | (8,8) | 0078 | 0078 | 11 | (10,4) |  | 0024 |
| 9 | (10,2) |  | 0060 | 11 | (10,8) |  | 0018 |
| 9 | (10,6) |  | 0078 |  |  |  |  |

* AN ENCODING/DECODING SELECTION SIGNAL IS ALSO SUPPLIED TO THE MODULES.

FIG. 15

| s11 (ADS,RDS,Number) | r12 (HEX) y11 = 0 | r12 (HEX) y11 = 1 | s12 y11 = 0 | s12 y11 = 1 |
|---|---|---|---|---|
| (0,2,0) | 00 | | (1,1,0) | |
| (0,2,1) | 00 | | (1,1,1) | |
| (0,2,2) | 00 | | (1,1,2) | |
| (0,6,0) | 0c | | (1,5,1) | |
| (2,0,0) | | 00 | | (1,1,0) |
| (2,0,1) | | 00 | | (1,1,1) |
| (2,0,2) | | 00 | | (1,1,2) |
| (2,4,0) | 13 | 09 | (3,3,0) | (1,5,0) |
| (2,4,1) | 17 | 0c | (3,3,1) | (1,5,1) |
| (2,4,2) | 04 | 03 | (3,3,2) | (1,5,2) |
| (2,8,0) | 22 | 0c | (3,7,0) | (1,9,0) |
| (4,2,0) | 0b | 13 | (5,1,0) | (3,3,0) |
| (4,2,1) | 0c | 17 | (5,1,1) | (3,3,1) |
| (4,2,2) | 01 | 04 | (5,1,2) | (3,3,2) |
| (4,6,0) | 1d | | (5,5,0) | |
| (4,6,1) | 30 | 22 | (5,5,1) | (3,7,0) |
| (4,6,2) | 13 | 22 | (5,5,2) | (3,7,1) |
| (4,10,0) | 24 | | (5,9,0) | |
| (6,0,0) | | 0b | | (5,1,0) |
| (6,0,1) | | 0c | | (5,1,1) |
| (6,0,2) | | 01 | | (5,1,2) |
| (6,4,0) | 1c | 1d | (7,3,0) | (5,5,0) |
| (6,4,1) | 23 | 30 | (7,3,1) | (5,5,1) |
| (6,4,2) | 07 | 13 | (7,3,2) | (5,5,2) |
| (6,8,0) | 2e | 24 | (7,7,0) | (5,9,0) |
| (8,2,0) | 0b | 1c | (9,1,0) | (7,3,0) |
| (8,2,1) | 0c | 23 | (9,1,1) | (7,3,1) |
| (8,2,2) | 01 | 07 | (9,1,2) | (7,3,2) |
| (8,6,0) | 14 | | (9,5,0) | |
| (8,6,1) | 24 | 2e | (9,5,1) | (7,7,0) |
| (8,6,2) | 10 | 2e | (9,5,2) | (7,7,1) |
| (8,10,0) | 18 | | (9,9,0) | |
| (10,4,0) | | 14 | | (9,5,0) |
| (10,4,1) | | 24 | | (9,5,1) |
| (10,4,2) | | 10 | | (9,5,2) |
| (10,8,0) | | 18 | | (9,9,0) |

ENCODER

DECODER

ENCODING APPARATUS AND METHOD, DECODING APPARATUS AND METHOD, AND DISTRIBUTION MEDIA

BACKGROUND OF THE INVENTION

1. Field of the Invention

The present invention relates to an encoding apparatus and method, a decoding apparatus and method, and distribution media, and more particularly to an encoding apparatus and method, a decoding apparatus and method, and distribution media for performing encoding and decoding by use of a finite-state transition diagram.

2. Description of the Related Art

A block encoding method is well-known as a conventional recording/encoding method. That is, this method performs block conversion from m-bit data into n-bit code words. In this case, the size of blocks for block conversion has a close relation to the ease of manufacturing an apparatus. An encoding rate is represented by m/n; two encoding rates m/n=8/10 and m/n=10/20 will be considered herein. Although both are the same in encoding rate, the block size in the latter is twice as large.

In the encoding of m/n=8/10, $2^8$ code words are selected from $2^{10}$ code words. In the encoding of m/n=16/20, $2^{16}$ code words are selected from $2^{20}$ code words. In this case, apparently, the latter has more code word candidates and greater freedom. Accordingly, when required restrictions are imposed on codes, more strict conditions can be put on the latter codes. This suggests the possibility that more efficient codes can be generated.

However, the following drawback exists in the above-described block conversion technique. As in an encoder shown in FIG. 16A and a decoder shown in FIG. 16B, when they are configured with ROM (Random Access Memory), PLA (Programmed Logic Array), or random logic circuits, the circuit size becomes larger like an exponential function for codes of large blocks, e.g., m/n=16/20, than for codes of small blocks, e.g., m/n=8/10. In other words, for codes of m/n=8/10, a table showing a one-to-one correspondence between $2^8$ pieces of data and code words are embodied with an encoder and a decoder, while, for codes of m/n=16/20, a table showing a one-to-one correspondence between $2^{16}$ pieces of data and code words must be embodied with an encoder and a decoder.

When an encoder and a decoder are configured with a PLA and a random logic circuit, the way of associating data words with code words exerts a great influence on the apparatus size. For codes of small blocks, it is relatively easy to establish a correspondence suitable for apparatus manufacturing, but the larger the block, the more difficult it becomes to find out a correspondence suitable for apparatus manufacturing.

In the logic synthesis by a logic synthesis program, as a block became larger, processing necessary for the synthesis increases like an exponential function and the processing capacity is exceeded, sometimes resulting in failure of the synthesis and requiring a huge amount of time for the synthesis.

SUMMARY OF THE INVENTION

The present invention has been made in view of such circumstances, and its object is to perform encoding and decoding by use of a finite-state transition diagram to make the circuit size small and improve processing speed.

An encoding apparatus as set forth in claim 1 comprises: a first setting means for setting state transition s on a finite-state transition diagram, corresponding to a code; a second setting means for setting a reference value r by use of the state transition s set by the first setting means; a third setting means for setting a pointer p indicating what data word w of the data is being processed; a comparison means for comparing the reference value r set by the second setting means and the value of the pointer p set by the third setting means; and an output means, when it is judged by the comparison means that the pointer p is greater than or equal to the reference value r, for setting the symbol of a code word bit y to either of 1 and 0 and updating the value of the pointer p to (p−r) and outputting it, and when it is judged that the pointer p is smaller than the reference value r, setting the symbol of the code word bit y to the other of 1 and 0 and outputting the value of the pointer p without updating it.

An encoding method as set forth in claim 6 comprises: a first setting step for setting state transition s on a finite-state transition diagram, corresponding to a code; a second setting step for setting a reference value r by use of the state transition s set by the first setting step; a third setting step for setting a pointer p indicating what data word w of the data is being processed; a comparison step for comparing the reference value r set by the second setting step and the value of the pointer p set by the third setting step; and an output means, when it is judged by the comparison step that the pointer p is greater than or equal to the reference value r, for setting the symbol of a code word bit y to either of 1 and 0 and updating the value of the pointer p to (p−r) and outputting it, and when it is judged that the pointer p is smaller than the reference value r, setting the symbol of the code word bit y to the other of 1 and 0 and outputting the value of the pointer p without updating it.

A distribution media as set forth in claim 7 is used to distribute a computer-readable program for executing a process comprising: a first setting step for setting state transition s on a finite-state transition diagram, corresponding to a code; a second setting step for setting a reference value r by use of the state transition s set by the first setting step; a third setting step for setting a pointer p indicating what data word w of the data is being processed; a comparison step for comparing the reference value r set by the second setting step and the value of the pointer p set by the third setting step; and an output means, when it is judged by the comparison step that the pointer p is greater than or equal to the reference value r, for setting the symbol of a code word bit y to either of 1 and 0 and updating the value of the pointer p to (p−r) and outputting it, and when it is judged that the pointer p is smaller than the reference value r, setting the symbol of the code word bit y to the other of 1 and 0 and outputting the value of the pointer p without updating it.

A decoding apparatus as set forth in claim 8 comprises: a first setting means for setting state transition s on a finite-state transition diagram, corresponding to a code; a counting means for counting n as one cycle; a second setting means for setting a reference value r by use of the state transition s set by the first setting means and a counter value i outputted from the counting means; a third setting means for setting a pointer p indicating the minimum value of the range of data to be processed; a judgment means for judging the symbol of a code word bit y; an output means, when it is judged by the judgment means that the symbol of the code word bit y is either of 0 and 1, for updating the value of the pointer p to (p+r) and outputting it, and when it is judged that the symbol of the code word bit y is the other of 0 and 1, outputting the pointer p without updating it; and a determination means for judging whether a counter value i outputted from the counter means is equal to (n−1), and when it is judged that the counter value i is equal to (n−1), determining the pointer p outputted from the output means as a data word w.

A decoding method as set forth in claim 12 comprises: a first setting step for setting state transition s on a finite-state transition diagram, corresponding to a code; a counting step for counting n as one cycle; a second setting step for setting a reference value r by use of the state transition s set by the first setting step and a counter value i outputted from the counting step; a third setting step for setting a pointer p indicating the minimum value of the range of data to be processed; a judgment step for judging the symbol of a code word bit y; an output step, when it is judged by the judgment step that the symbol of the code word bit y is either of 0 and 1, for updating the value of the pointer p to (p+r) and outputting it, and when it is judged that the symbol of the code word bit y is the other of 0 and 1, outputting the pointer p without updating it; and a determination step for judging whether a counter value i outputted from the counting step is equal to (n−1), and when it is judged that the counter value i is equal to (n−1), determining the pointer p outputted from the output step as the data word w.

A distribution media as set forth in claim 13 is used to distribute a computer-readable program for executing a process comprising: a first setting step for setting state transition s on a finite-state transition diagram, corresponding to a code; a counting step for counting n as one cycle; a second setting step for setting a reference value r by use of the state transition s set by the first setting step and a counter value i outputted from the counting step; a third setting step for setting a pointer p indicating the minimum value of the range of data to be processed; a judgment step for judging the symbol of a code word bit y; an output step, when it is judged by the judgment step that the symbol of the code word bit y is either of 0 and 1, for updating the value of the pointer p to (p+r) and outputting it, and when it is judged that the symbol of the code word bit y is the other of 0 and 1, outputting the pointer p without updating it; and a determination step for judging whether a counter value i outputted from the counting step is equal to (n−1), and when it is judged that the counter value i is equal to (n−1), determining the pointer p outputted from the output step as a data word w.

According to an encoding apparatus as set forth in claim 1, an encoding method as set forth in claim 6, and a distribution media as set forth in claim 7, a state transition s on a finite-state transition diagram, corresponding to a code is set; a reference value r is set using the set state transition s; a pointer p indicating what data word w of the data is being processed is set; and when the pointer p is greater than or equal to the reference value r, the symbol of a code word bit y is set to either of 1 and 0 and the value of the pointer p is updated to (p−r) and outputted, and when the pointer p is smaller than the reference value r, the symbol of a code word bit y is set to the other of 1 and 0 and the value of the pointer p is outputted without being updated.

According to a decoding apparatus as set forth in claim 8, a decoding method as set forth in claim 12, and a distribution media as set forth in claim 13, state transition s on a finite-state transition diagram, corresponding to a code is set; n is counted as one cycle; a reference value r is set using the set state transition s and a counted counter value i; a pointer p indicating the minimum value of the range of data to be processed is set; when the symbol of the code word bit y is either of 0 and 1, the value of the pointer p is updated to (p+r) and outputted, and when the symbol of the code word bit y is the other of 0 and 1, the pointer p is outputted without being updated; and it is judged whether the counter value i is equal to (n−1), and when it is judged that the counter value i is equal to (n−1), the pointer p is determined as a data word w.

BRIEF DESCRIPTION OF THE DRAWINGS

FIG. 2 is a finite-state transition diagram.

FIG. 5 is a diagram showing data stored in a code word count storing circuit.

FIG. 6 is a diagram showing part of data stored in a state transition storing circuit.

FIG. 8 is a flowchart for explaining the operation of a decoder.

FIG. 11 is a diagram showing part of data stored in a code word count storing circuit.

FIG. 15 is a diagram showing part of data stored in the code word count storing circuit and the state transition storing circuit.

DETAILED DESCRIPTION OF THE PREFERRED EMBODIMENTS

Figure 1:
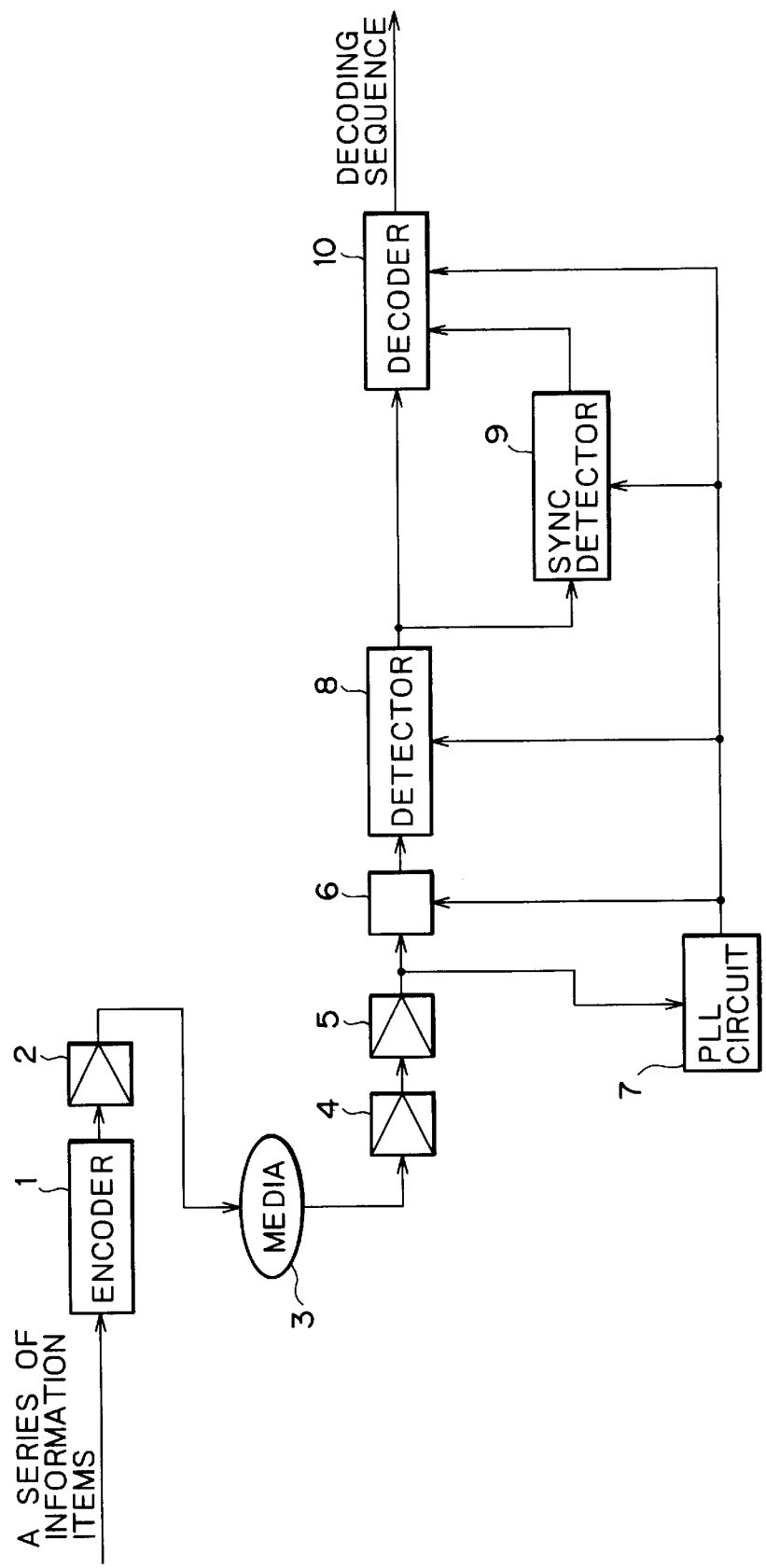
FIG. 1 is a block diagram showing a configuration of a recording/reproducing apparatus to which the present invention is applied.

Hereinafter, embodiments of the present invention will be described. To clarify a correspondence between means of the present invention described in claims and the embodiments described below, the characteristics of the present invention will be described in a form that parenthesizes a corresponding embodiment (herein, one embodiment) after each means, as shown below. However, this description does not denote that the present invention is limited to the described means. Portions corresponding to prior arts are assigned identical reference numerals, and the explanations are omitted as required.

An encoding apparatus as set forth in claim 1 comprises: a first setting means (e.g., a state transition storing circuit 26 in FIG. 3) for setting state transition s on a finite-state transition diagram, corresponding to a code; a second setting means (e.g., a code word count storing circuit 28 in FIG. 3) for setting a reference value r by use of the state transition s set by the first setting means; a third setting means (e.g., a selector 29 in FIG. 3) for setting a pointer p indicating what data word w of the data is being processed; a comparison means (e.g., a subtracter 24 in FIG. 3) for comparing the reference value r set by the second setting means and the value of the pointer p set by the third setting means; and an output means (e.g., steps S6 to S8 in FIG. 4), when it is judged by the comparison means that the pointer p is greater than or equal to the reference value r, for setting the symbol of a code word bit y to either of 1 and 0 and updating the value of the pointer p to (p−r) and outputting it, and when it is judged that the pointer p is smaller than the reference value r, setting the symbol of the code word bit y to the other of 1 and 0 and outputting the value of the pointer p without updating it.

A decoding apparatus as set forth in claim 8 comprises: a first setting means (e.g., a state transition storing circuit 46 in FIG. 7) for setting state transition s on a finite-state transition diagram, corresponding to a code; a counting means (e.g., a bit counter 50 in FIG. 7) for counting n as one cycle; a second setting means (e.g., a code word storing circuit 48 in FIG. 7) for setting a reference value r by use of the state transition s set by the first setting means and a counter value i outputted from the counting means; a third setting means (e.g., a selector 49 in FIG. 7) for setting a pointer p indicating the minimum value of the range of data to be processed; a judgment means (e.g., step S26 in FIG. 8) for judging the symbol of a code word bit y; an output means (e.g., step S27 in FIG. 8), when it is judged by the judgment means that the symbol of the code word bit y is either of 0 and 1, for updating the value of the pointer p to (p+r) and outputting it, and when it is judged that the symbol of the code word bit y is the other of 0 and 1, outputting the pointer p without updating it; and a determination means (e.g., step S31 in FIG. 8) for judging whether a counter value i outputted from the counter means is equal to (n−1), and when it is judged that the counter value i is equal to (n−1), determining the pointer p outputted from the output means as a data word w.

FIG. 1 is a block diagram showing a configuration of a recording/reproducing apparatus to which the present invention is applied. To an encoder 1, a series of information items (binary data) such as, e.g., video data, audio data, and other data to be recorded on media 3 is inputted m bits at a time, wherein the media 3 comprises e.g., optical disk, magneto-optical disk, magnetic disk, magnetic tape, and phase change disk. The encoder converts (encodes) the inputted m-bit data word into a code word having a code length of n bits and outputs the code word to a recording amplifier 2. The recording amplifier 2 amplifies a code sequence as serial data from the encoder 1 and records the result on the media 3.

A reproducing amplifier 4 amplifies a reproducing signal from the media 3 and supplies it to an equalizer amplifier 5. The equalizer amplifier 5 subjects the reproducing signal from the reproducing amplifier 4 to waveform equalization and supplies the result to a sampling unit 6 and a PLL (Phase Locked Loop) circuit 7. The sampling unit 6 samples the reproducing signal from the equalizer amplifier 5 in accordance with a clock from the PLL circuit 7 and outputs a resulting sample value to a detector 8. The detector 8 detects a code word sequence from the sample value supplied from the sampling unit 6 and supplies the detection result to a decoder 10.

The decoder 10 decodes a code word having a code length of n bits to the original m-bit data word. The PLL circuit 7 generates a clock based on the reproducing signal from the equalizer amplifier 5 and outputs it the sampling unit 6, a SYNC detector 9, and the decoder 10. The sampling unit 6, the SYNC detector 9, and the decoder 10 are constructed to operate in accordance with the clock from the PLL circuit 7.

The SYNC detector 9 detects a SYNC pattern (symbol synchronization pattern) from a code sequence supplied from the detector 8 and supplies the detection result to decoder 10.

The encoder 1 is constructed based on a finite-state transition diagram (FDTS) representing restrictions on a code sequence. Specifically, as shown in FIG. 2, a finite-state transition diagram representing restrictions of ADS (Alternating Digital Sum) and RDS (Running Digital Sum) will be used. States on the a finite-state transition diagram shown in FIG. 2 will be represented by (ADS, RDS).

Here, it is to be noted that four states in which a code word serves as a starting point and as an ending point are represented by (3, 3), (3, 7), (7, 3), and (7, 7), and m is 16 and n is 20. It is also to be noted that a 16-bit data word is w, a 20-bit code word is represented by an expression $y y y_0, \ldots, y_{19}$ ($y_i$ is the i-th bit from a starting point on the finite-state transition diagram), and a state transition corresponding to a code word is represented by an expression $s=s_0, \ldots, s_{20}$ ($s_0$ is the state of a starting point, and s20 is the state of an ending point). Encoding is performed one bit at a time sequentially from $y_0$. Herein, pointer $p=p_0, \ldots, p_{19}$ and a reference value $r=r_0, \ldots, r_{19}$ are defined.

According to an encoding method of the embodiment, when data words are arranged in ascending order by their value, and with $y_0$ as MSB (Most Significant Bit), code words with each of the states of starting points as a starting point are arranged in ascending order by their value, they are associated in pairs of the words of the same sequence. In this case, encoding is performed in a way that searches for a code word having the same sequence as that of a data word w.

If encoding is started from a state (3, 3), $s_0=(3, 3)$. When the state $s_0$ is a starting point, the total number of 20-bit code word candidates is 124,416, which is greater than the number $2^{16}$ (=65,536) of 16-bit data words. This indicates that a one-to-one correspondence can be taken between data words and code words, that is, that 16-bit data words can all be encoded.

Letting $p_0=w$, $p_0$ indicates the position of a data word w in a data word sequence in ascending order. Next, the total number of 20-bit code word candidates with the state $s_0$ as a starting point and $y_0$ equal to 0 is 41,472. The total number of 20-bit code word candidates with $y_0$ equal to 1 is 82,944 (=124,416−41,472). This means that $y_0$ of the first 41,472 code words in ascending order by value is 0 and $y_0$ of the next 82,944 code words is 1. If a reference value is 41,472, since both data words and code words are arranged and associated in ascending order by value, it is found that, if $p_0$ is smaller than $r_0$, $y_0$ is 0, and if $p_0$ is greater than or equal to $r_0$, $y_0$ is 1. That is, $y_0$ can be first determined depending on whether $p_0$ is smaller than $r_0$.

Furthermore, assuming that po is smaller than $r_0$, consider a method for determining $y_1$. Although the range of data currently concerned is up to the first $r_0$ pieces of data, if $p_1=p_0$, $p_1$ indicates the position of a data word w in a data word sequence in ascending order within the range. Since $y_0$ is 0, the state changes from $s_0=(3, 3)$ to $s_1=(2, 2)$. The total number of 19-bit code word candidates with the state $s_1$ as a starting point and $y_1$ equal to 0 is 20,736. The total number of 19-bit code word candidates with $y_1$ equal to 1 is 20,736 (=$r_0$−20,736). In the same way as when $y_0$ is determined, if the total number 20,736 of 19-bit code word candidates with $y_1$ equal to 0 is defined as a reference value $r_1$, it is found that, if $p_1$ is smaller than $r_1$, $y_1$ is 0, and if $p_1$ is greater than or equal to $r_1$, $y_1$ is 0. The reason that the code length is 19 bits herein is that $y_0$ has already been determined.

Next, assuming that $p_0$ is greater than or equal to $r_0$, consider a method for determining $y_1$. Herein, the ($r_0$+1)-th and beyond of data words and code words arranged in ascending order by value are subject to processing. Accordingly, letting $p_1=p_0-r_0$, $p_1$ indicates the position of a data word w of a data word sequence in ascending order within a processing range. In this case, since $y_0$ is 1, the state changes from $s_0$=(3, 3) to $s_1$=(4, 4). The total number of 19-bit code word candidates with the state $s_1$ as a starting point and $y_1$ equal to 0 is 41,472. The total number of 19-bit code word candidates with $y_1$ equal to 1 is 41,472 (=82,944−41,472). If the number 41,472 of 19-bit code word candidates with $y_1$ equal to 0 is defined as a reference value $r_1$, since $p_1$ is always smaller than $r_1$, it is found that $y_1$ is 0. In this example, since $p_1$ can assume only values smaller than $r_1$, it has been uniquely determined that $y_1$ is 0. However, when $p_1$ can assume values greater than or equal to $r_1$, if $p_1$ is a value greater than or equal to $r_1$, it is determined that $y_1$ is 1.

In this way, $y_0$ and $y_1$ are determined. Hereinafter, $y_2$ to $y_{19}$ are determined in the same way.

Figure 3:
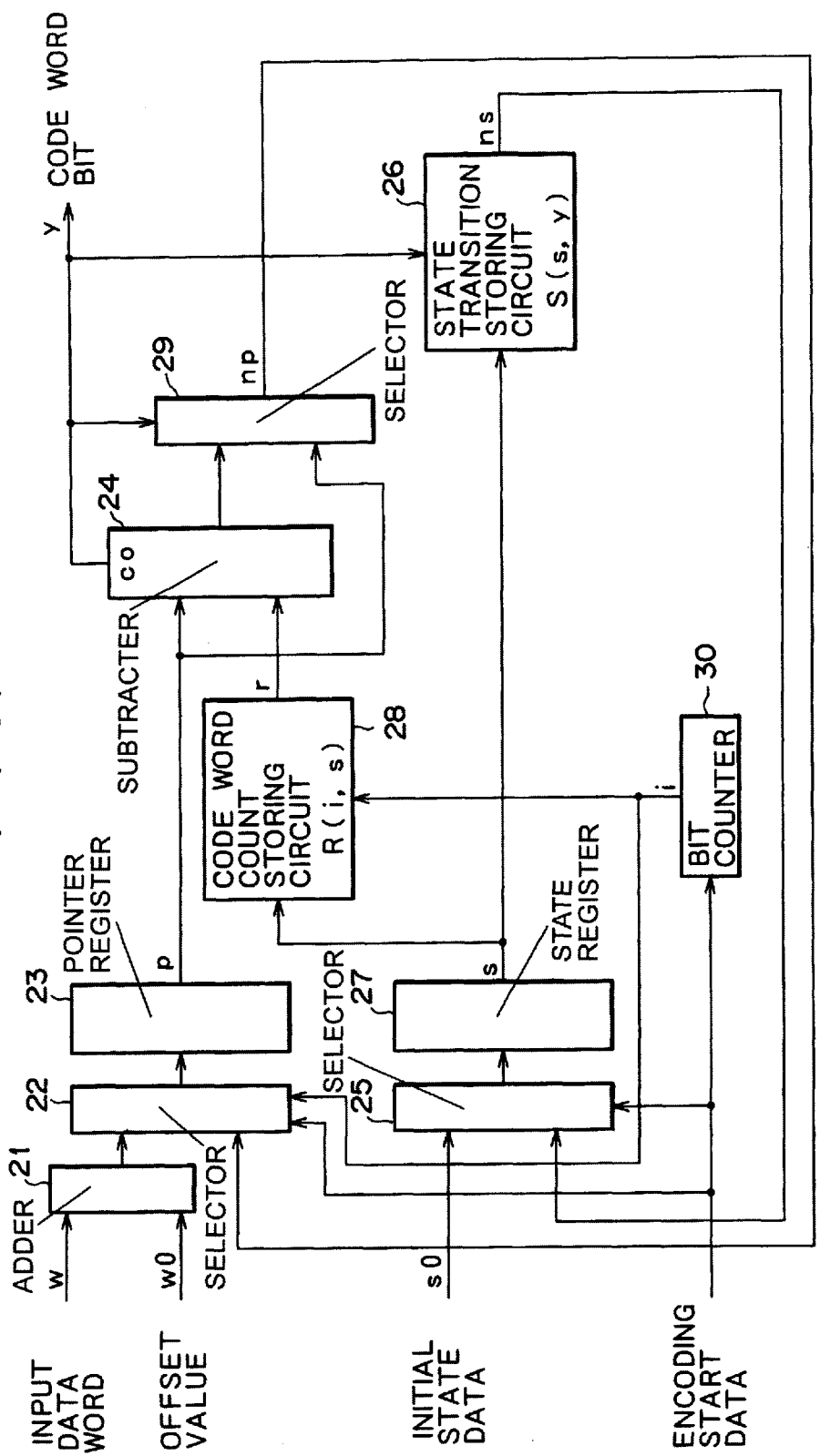
FIG. 3 is a block diagram showing a configuration of an encoder.

FIG. 3 is a block diagram showing a configuration of the encoder 1 that performs encoding by the above-described method. A data word inputted to an adder 21 is outputted to a pointer register 23 via a selector 22. The pointer register 23 outputs a pointer to a subtracter 24.

A selector 25 selects either of inputted initial state data and data outputted from a state transition storing circuit 26 and outputs it to a code word count storing circuit 28 via a state register 27. Data outputted from the code word count storing circuit 28 is inputted to the subtracter 24. The subtracter 24 performs subtraction processing between the data outputted from the pointer register 23 and the data outputted from the code word count storing circuit 28, and outputs the result to a selector 29, the state transition storing circuit 26, and the recording amplifier 2 (FIG. 1). Data outputted from the selector 29 is returned to the selector 22.

Encoding start data is inputted to the selector 22 and a bit counter 30 in addition to a selector 25. Data outputted from the bit counter 30 is inputted to the selector 22 and the code word count storing circuit 28.

Figure 4:
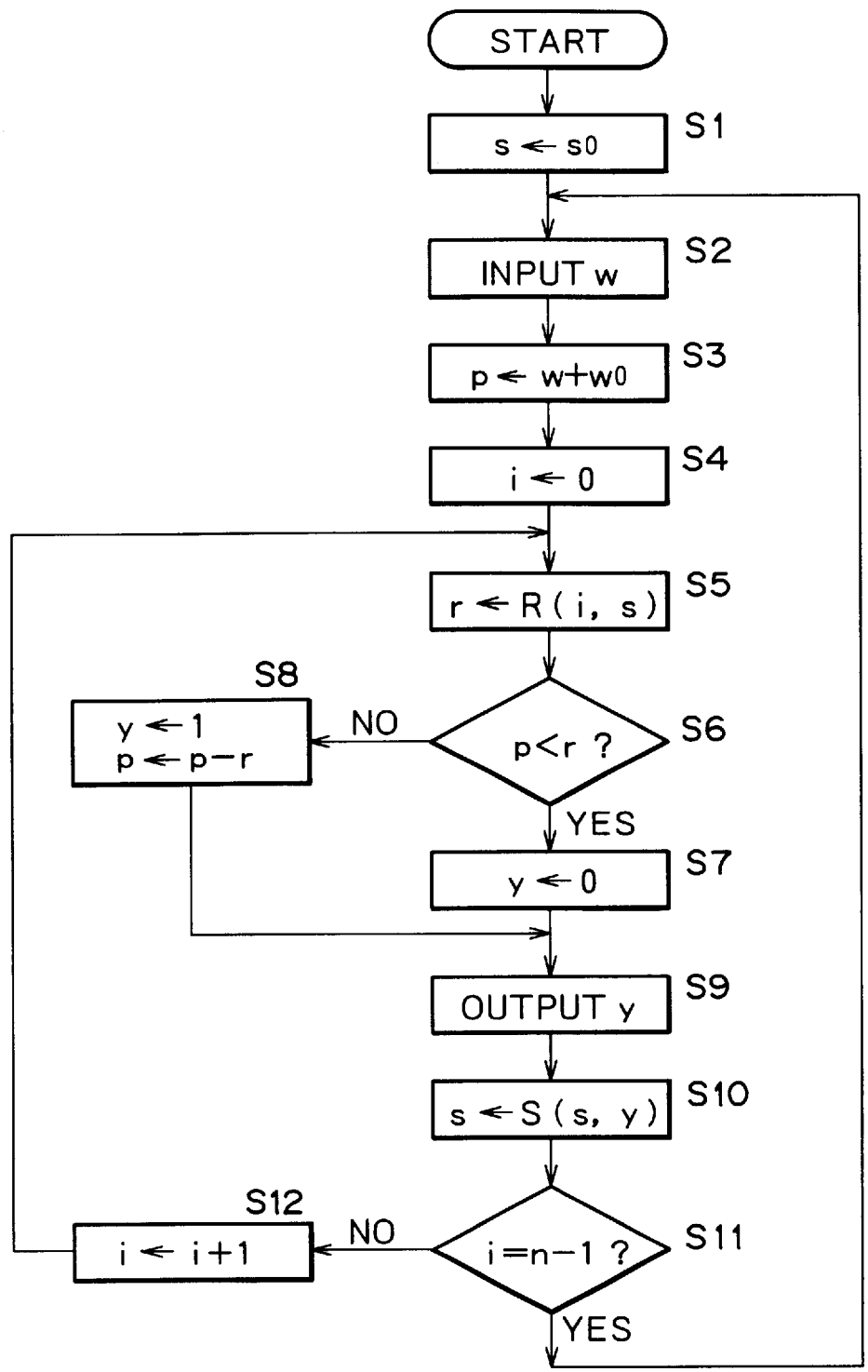
FIG. 4 is a flowchart for explaining the operation of an encoder.

FIG. 4 shows a flowchart of the encoding process of the encoding apparatus 1. In this example, a code length is n, the initial state of encoding is $s_0$, and an offset value is $w_0$. In step S1, upon the start of encoding, a predetermined initial state so of encoding is loaded into the state register 27 indicating a current state s via the selector 25.

In step S2, a data word w is inputted to the adder 21. In step S3, the adder 21, when appending offset to the data word w, inputs an offset value $w_0$ and accordingly the pointer p is set to $w+w_0$. Hence, if offset is unnecessary, the adder 51 need not always be provided, and in step S3, the pointer w may be set to w.

Output i of the bit counter 30, which indicates the position of a code word bit y currently being processed, is initialized to 0 upon the input of an encoding start signal. If an initial state has been set as described above in steps S1 to S4, control proceeds to step S5 and encoding for the inputted data word w is started.

In step S5, the total number of code words with the current state s as a starting point and a code word bit y equal to 0 is obtained as a reference value r. Specifically, the code word count storing circuit 28 stores the number r of (n−1)-bit code word candidates with the current state s as a starting point and y equal to 0 so that the stored data is used to obtain the reference value r. The reference value r is represented by a function R of the output i of the bit counter 30 and the current state s. The number of code words stored may be defined as the number r of (n−1)-bit code word candidates with the state s as a starting point and y equal to 1.

In step S6, the pointer p and the reference value r are compared. As a result, if the pointer p is smaller than the reference value r, control proceeds to step S7 and 0 is assigned to the code word bit y. If the pointer p is greater than or equal to the reference value r, 1 is assigned to the code word bit y, the pointer p is updated to (p−r), and control proceeds to step S9.

Specifically, the pointer p outputted from the pointer register 23 and the reference value r outputted from the code word count storing circuit 28 are inputted to the subtracter 24 and (p−r) is calculated. If the output of the subtracter 24 is negative, the code word bit y is set to 0 (step S7); if positive, the code word bit y is set to 1 (step S8). This can be realized by using a carry-out (CO) bit of the subtracter 24 as the code word bit y. If an offset value w0 is 0, the width of bits required for the subtracter 24 is m bits. If an offset value w0 is greater than or equal to 0, an appropriate number of bits are added to the m bits in accordance with the magnitude of the offset value $w_0$.

In step S9, the obtained code word bit y is outputted. In step S10, the current state s is updated to the next state which depends on the code word bit y. Here, s can be represented as a function S of s and y. To be more specific, the code word bit y outputted from the subtracter 24 is outputted from the encoder 1 and is inputted to the selector 29 and the state transition storing circuit 26. The selector 29, if the code word bit y is 0, outputs the pointer p without updating, and if the code word bit y is 1, outputs (p−r) as the value of the pointer p. An output from the selector 29, with the bit counter 30 counted up, is loaded into the pointer register 23 via the selector 22, and the pointer p is updated.

Upon termination of processing of the first bit in this way, control proceeds to step S11, where it is judged whether i=n−1. If it is judged that i is not equal to (n−1), control proceeds to step S12, where the value of i is incremented by one, control returns to step S12 to perform processing for a reference value r, and subsequent processing is repeated.

On the other hand, if it is judged in step S11 that i is equal to (n−1), control returns to step S2 to input a code word w, and subsequent processing is continued. Specifically, the state transition storing circuit 26 stores the next state to go from the current state s in accordance with the code word bit y. An output from the state transition storing circuit 26, with the bit counter 30 counted up, is loaded into the state register 27 via the selector 25, and the current state s is updated.

The bit counter 30 is counted up from 0 to (n−1), and then returns to 0 again. As soon as the output of the bit counter 30 becomes 0, a new data word w is loaded into the pointer register 23 to start the next encoding. At the same time, the state register 27 is loaded with a state in which the code word outputted immediately before from the state transition storing circuit 26 serves as an ending point.

A code word bit is generally determined as follows. The total number of (n−i)-bit code word candidates with a current state s as a starting point and a code word bit y equal to 0 is defined as a reference value r, and if a pointer p is smaller than the reference value r, a code word y is determined as 0; if the pointer p is greater than or equal to the reference value r, the code word y is determined as 1 and the pointer p is updated to (p−r). The current state s is updated with a state uniquely determined from s and y.

In the above-described encoding process, with the first bit $y_0$ of 20-bit code as MSB, 16-bit data words and 20-bit code words are associated in pairs of the words of the same sequence when both of them are arranged in ascending order. When determining a code word $y_i$, the total number of (20−i)-bit code word candidates with a state $s_i$ as a starting point and a code word $y_i$ equal to 0 was defined as a reference value $r_1$. However, the total number of (20−i)-bit code word candidates with a state $s_i$ as a starting point and a code word $y_i$ equal to 1 may be defined as a reference value $r_1$. In this case, 16-bit data words arranged in ascending order and 20-bit code words arranged in descending order are associated in pairs of the data words of the same sequence.

In the above example, the total number of 20-bit code word candidates with the state (3, 3) as a starting point was grater than the total number of 16-bit data words. Accordingly, when both of 16-bit data words and 20-bit code words are arranged in ascending order and associated in pairs of the words of the same sequence (that is, when the total number of (20−i)-bit code word candidates with a code word $y_i$ equal to 0 is defined as a reference value $r_i$), there will exist redundant code words y having larger values as many as a surplus number. Also, when data words w are arranged in ascending order and code words y are arranged in descending order and they are associated in pairs of the words of the same sequence (that is, when the total number of (20−i)-bit code word candidates with a code word $y_i$ equal to 1 is defined as a reference value $r_i$), there will exist redundant code words y having smaller values as many as a surplus number. The number of the redundant code words y is the total number of 20-bit code word candidates with the state (3, 3) as a staring point minus the total number of 16-bit data words.

If the redundant code words are to be assigned to data words, offset $w_0$ should be appended to the data words w. To be more specific, with the adder 21 provided, $w=w+w_0$ should be executed as in processing of step S3, where $w_0$ is a value smaller than or equal to the above-described redundant number.

FIG. 5 shows part of contents stored in the code word count storing circuit 28 when states (ADS, RDS) with a code word as a starting point are (3, 3), (3, 7), (7, 3), and (7, 7), and m and n are 16 and 20, respectively. FIG. 6 shows contents stored in the state transition storing circuit 26. FIG. 5 shows a table when i is from 8 to 11, storing about a fifth of the amount of data stored in the code word count storing circuit 28. Conventional encoders must store a table showing a correspondence between at least $2^{16}$ data words and code words. It will be understood from FIGS. 5 and 6 that the encoder 1 of the embodiment can be greatly reduced in circuit size, compared with conventional apparatuses.

Consider the large unit of encoding as in the case where, e.g., m is 32 and n is 40. The contents of the state transition storing circuit 26 shown in FIG. 6 are unchanged regardless of increasing values of n because the output thereof depends on only a current state s and a code word bit (0 or 1). It can be said that the contents of the code word count storing circuit 28 increase almost in proportion to n because they are represented as a function of i. The adder, selectors, and the like increase in bit width as m increases. On the other hand, since conventional encoders must store a table showing a correspondence between $2^m$ data words and code words, the size of the encoders increases like a exponential function as the unit of encoding becomes larger. It will be understood from this fact that the encoder 1 of the present embodiment becomes more effective as the unit of encoding becomes larger. The same is also true of a decoder described later.

A code sequence as serial data thus encoded is recorded supplied to the media 3 via the recording amplifier 2. When data recorded on the media 3 has been reproduced, a resultant reproduction signal is amplified in the reproduction amplifier 4, and then is equalized in the equalizer amplifier 5 and supplied to the sampling circuit 6 and the PLL circuit 7. The PLL circuit 7 generates a clock from the inputted reproduction signal and supplies the generated clock to the sampling circuit 6, detector 8, SYNC detector 9, and decoder 10.

On the other hand, the sampling circuit samples the disturbed reproduction signal from the equalizer amplifier 5 synchronously with the clock supplied from the PLL circuit 7. A resultant sample value is supplied to the detector 8, and thereby the original code sequence is detected. The code sequence detected in the detector 8 is supplied to the SYNC detector 9, where a SYNC pattern is detected. A synchronization signal for a resultant code word is supplied to the decoder 10, where synchronization is taken. The code sequence detected in the detector 8 is supplied to the decoder 10, and thereby the original m-bit data is decoded. Next, the decoding process will be described. Suppose no error is found in detected code words and a code word $y=y_0, \ldots, y_{n-1}$ outputted from an encoder is used directly for the decoding process. Like the encoding process, the decoding process is also performed one bit at a time sequentially from $y_0$.

First, a pointer $p_0$ is initialized to 0. In the decoding process, a pointer $p_i$ indicates the minimum value of the range of data words to be currently (that is, a time of i) processed. Since the range of data words is unknown at a time indicated by i of 0, the pointer $p_0$ is set to 0.

Code words with a state $s_0=(3, 3)$ as a starting point and a bit $y_0$ equal to 0 were, during encoding, associated with data words w the values of which are smaller than a reference value $r_0$ (the reference value $r_0$ is 41,472, which is the total number of 20-bit code words with the state $s_0$ as a starting point and the bit $y_0$ equal to 0). Code words y with the bit $y_0$ equal to 1 were associated with data words w the values of which are greater than or equal to the reference value $r_0$. Therefore, it can be determined that, when the bit $y_0$ is 0, the value of data words w is one of values from 0 to $(r_0-1)$, and when the bit $y_0$ is 1, the value of data words w is greater than or equal to the reference value $r_0$. In other words, since the pointer $p_0$ is defined as 0, when the bit $y_0$ is 0, the value of data words w is one of values from $p_0$ to $(p_0+r_0-1)$, and when the bit $y_0$ is 1, the value of data words w is greater than or equal to $(p_0+r_0)$.

Assuming that the bit $y_0$ is 0, consider the decoding process for the bit $y_1$. Since the bit $y_0$ is 0, the state changes from $s_0$ to $s_1=(2, 2)$. Since the value of a data word w to be decoded is one of values from $p_0$ to $(p_0+r_0-1)$, a pointer $p_1$ is set equal to po. Code words with the state $s_1$ as a starting point and a bit $y_1$ equal to 0 were, during encoding, associated with data words w the values of which are greater than or equal to the minimum value $p_1$ and smaller than $(p_1+r_1)$ (the reference value $r_1$ is the number 20,736 of 19-bit code words with the state $s_1$ as a starting point and the bit $y_1$ equal to 0). Code words with bit $y_1$ equal to 1 were associated with data words w the values of which are greater than or equal to $(p_1+r_1)$. Accordingly, it can be determined that, when bit $y_1$ is 0, the value of data words w is one of values from $p_1$ to $(p_1+r_1-1)$, and when bit $y_1$ is 1, the value of data words w is greater than or equal to $(p_1+r_1)$.

Next, assuming that the bit $y_0$ is 1, consider the decoding process for the bit $y_1$. Since the bit $y_0$ is 1, the state changes from $s_0$ to $s_1=(4, 4)$. Since the value of a data word w to be decoded is greater than or equal to $(p_0+r_0)$, a pointer $p_1$ is set equal to $p_0+r_0$. Code words with the state $s_1$ as a starting point and a bit $y_1$ equal to 0 were, during encoding, associated with data words w the values of which are greater than or equal to the minimum value $p_1$ and smaller than $(p_1+r_1)$ (the reference value $r_1$ is the number 41,472 of 19-bit code words with the state $s_1$ as a starting point and the bit $y_1$ equal to 0). Code words with the bit $y_1$ equal to 1 were associated with data words w the values of which are greater than or equal to $(p_1+r_1)$. Accordingly, it can be determined that, when the bit $y_1$ is 0, the value of data words w is one of values from $p_1$ to $(p_1+r_1-1)$, and when bit $y_1$ is 1, the value of data words w is greater than or equal to $(p_1+r_1)$.

Figure 7:
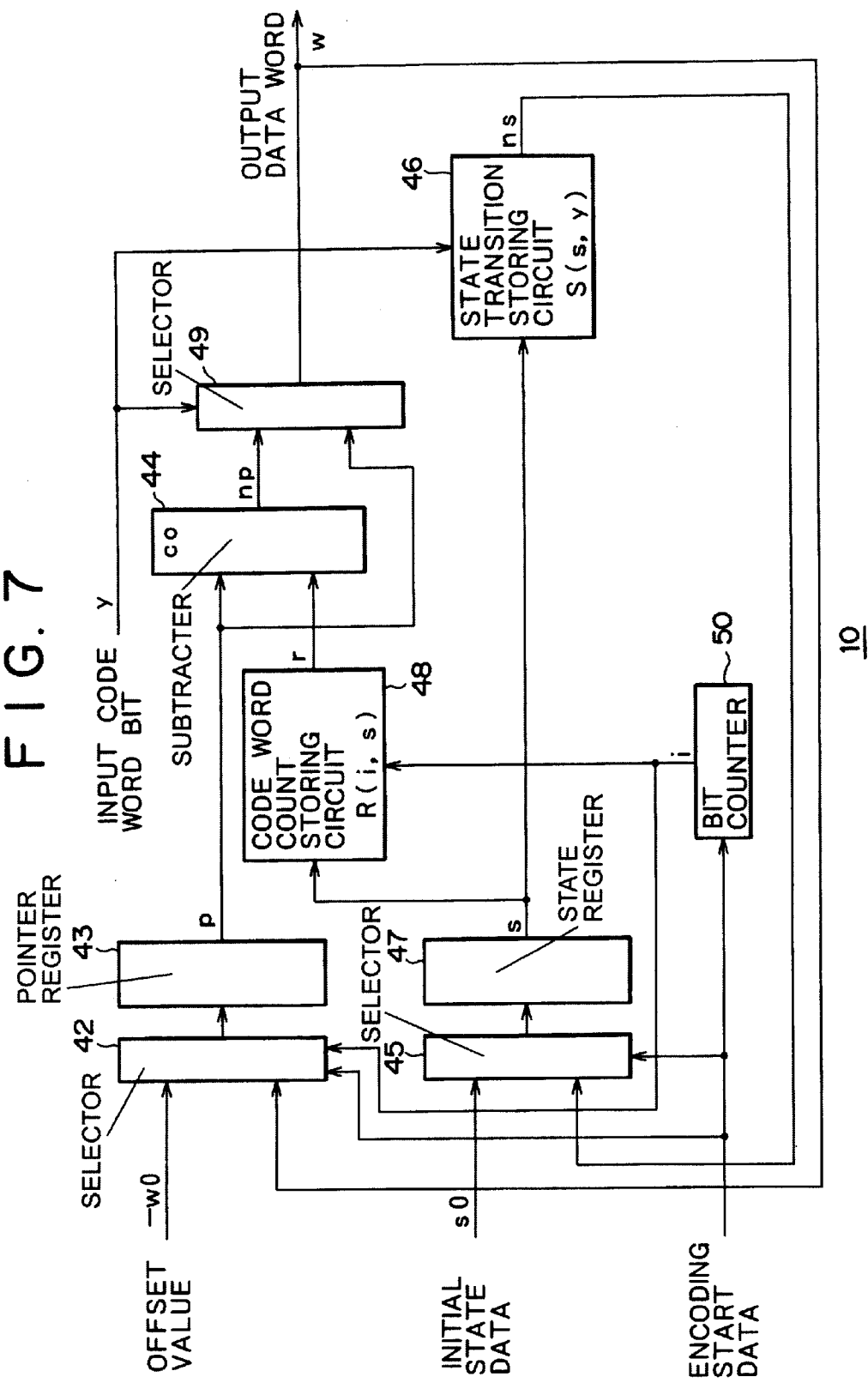
FIG. 7 is a block diagram showing a configuration of a decoder.

FIG. 7 is a block diagram showing a configuration of the decoder 10 for performing the decoding process as described above. A selector 42 selects either of an offset value $-w_0$ and data outputted from a selector 49, and outputs it to a pointer register 43. The pointer register 43 outputs a pointer p to an adder 44.

A selector 45 selects either of inputted initial state data and data outputted from a state transition storing circuit 46 and outputs it to a code word count recording circuit 48 via a state register 47. Data outputted from the code word count storing circuit 48 is inputted to the adder 44. The adder 44 performs subtraction processing between the data outputted from the pointer register 43 and the data outputted from the code word count storing circuit 48, and outputs the result to a selector 49. The data outputted from the selector 49 is returned to the selector 42 and supplied to other apparatuses as decoded data.

Encoding start data is inputted to the selector 42 and a bit counter 50 as well as the selector 45. Data outputted from the bit counter 50 is inputted to the selector 42 and the code word count storing circuit 48.

Referring to the flowchart of FIG. 8, the encoding process performed by the decoder 10 will be described. As in the decoding process, a code length is n, the initial state of decoding is $s_0$, and an offset value is $w_0$.

Upon the start of encoding, in step S21, the initial state $s_0$ is assigned to a current state s. Specifically, at the same time as the generation of a decoding start signal, the same state $s_0$ as the initial state of encoding is loaded into the status register 47 via the selector 45. In step S22, $(-w_0)$ is assigned to the pointer p ($w_0$ is the same as an offset value afforded during encoding) and the pointer p is set. That is, the offset value $(-w_0)$ afforded during encoding as the initial value of the pointer p is loaded into the pointer register 43 via the selector 42.

In step S23, 0 is assigned to i. Specifically, the output i of the bit counter 50 indicates the position of a code word bit y currently being processed, and is initialized to 0 at the same time as the generation of the decoding start signal. After initialization has been thus performed, the first bit of the code word is inputted to perform processing. First, in step S24, a code word bit y with the current state s as a starting point is inputted. In step S25, a reference value r, which is the total number of code words with the code word bit y equal to 0, is obtained (r is the same as that at the encoding).

In step S26, it is judged whether the code word bit y is 0, and if not 0, control proceeds to step S27, (p+r) is assigned to the pointer p, and the pointer p is updated. When it is judged in step S26 that the code word bit y is 0, or when processing in step S27 terminates, in step S28, the current state s is updated to the next state s determined by the code word y. Although s is represented as a function S of s and $y_i$, S is the same as that at the encoding.

Specifically, the state transition storing circuit 46 used is exactly the same as the state transition storing circuit 26 (FIG. 3). The pointer p outputted from the pointer register 43 and the reference value r outputted from the code word count storing circuit 48 are inputted to the adder 44, where (p+r) is calculated. The inputted code word bit y is inputted to the selector 49 and the state transition storing circuit 46. The selector 49, if the code word bit y is 0, outputs the pointer p, and if the code word bit y is 1, outputs (p+r) as the pointer p. The output from the selector 49, with the bit counter counted up, is loaded into the pointer register 43 via the selector 42, and the pointer p is updated.

The code word count storing circuit 48 used is exactly the same as the code word count storing circuit 28 (FIG. 3). The output of the state transition storing circuit 46, with the bit counter 50 counted up, is loaded into the state register 47 via the selector 45, and the current state s is updated.

After the processing terminates for the first bit, control proceeds to step S29, where it is judged whether i is equal to (n−1). If it is judged that i is not equal to (n−1), control proceeds to step S30, where the value of i is incremented by one, control returns to step S24 to input a code word bit y, and subsequent processing is repeated.

On the other hand, if it is judged in step S29 that i is equal to (n−1), control returns to step S31, where the pointer p is assigned to the data word w, and in step S32, w is outputted as the decoding result. Control proceeds to step S22 to set a pointer, and subsequent processing is repeated.

Specifically, the bit counter 50 is counted up from 0 to (n−1), and then returns to 0 again. When the output of the bit counter is (n−1), the output of the selector 49 indicates the decoded data word w and this terminates the decoding of one code word. Next, as soon as the output of the bit counter 49 becomes 0, an offset $(-w_0)$ is loaded into the pointer register 43 to start the next decoding. At the same time, the state register 47 is loaded with a state in which the code word outputted immediately before from the state transition storing circuit 46 serves as an ending point.

Processing for a code word bit y is generally performed as follows. If a code word bit y is 1, the total number of (n−i)-bit code word candidates with a current state s as a starting point and a code word bit y equal to 0 is defined as a reference value r, and the pointer p is updated with (p+r). The current state s is updated with a state uniquely determined from s an y. The pointer p at the time of termination of processing for the n-th bit points to the decoded data word w.

When states (ADS, RDS) with a code word as a starting point are (3, 3), (3, 7), (7, 3), and (7, 7), and m and n are 16 and 20, respectively, contents stored in the code word count storing circuit 48 and contents stored in the state transition storing circuit 46 are the same as those in FIGS. 5 and 6. Conventional encoders must store a table showing a correspondence between at least $2^{16}$ data words and code words. It will be understood from FIGS. 5 and 6 that the encoder 10 of the embodiment, like the encoder 1, can be greatly reduced in circuit size, compared with conventional apparatuses.

Figure 9:
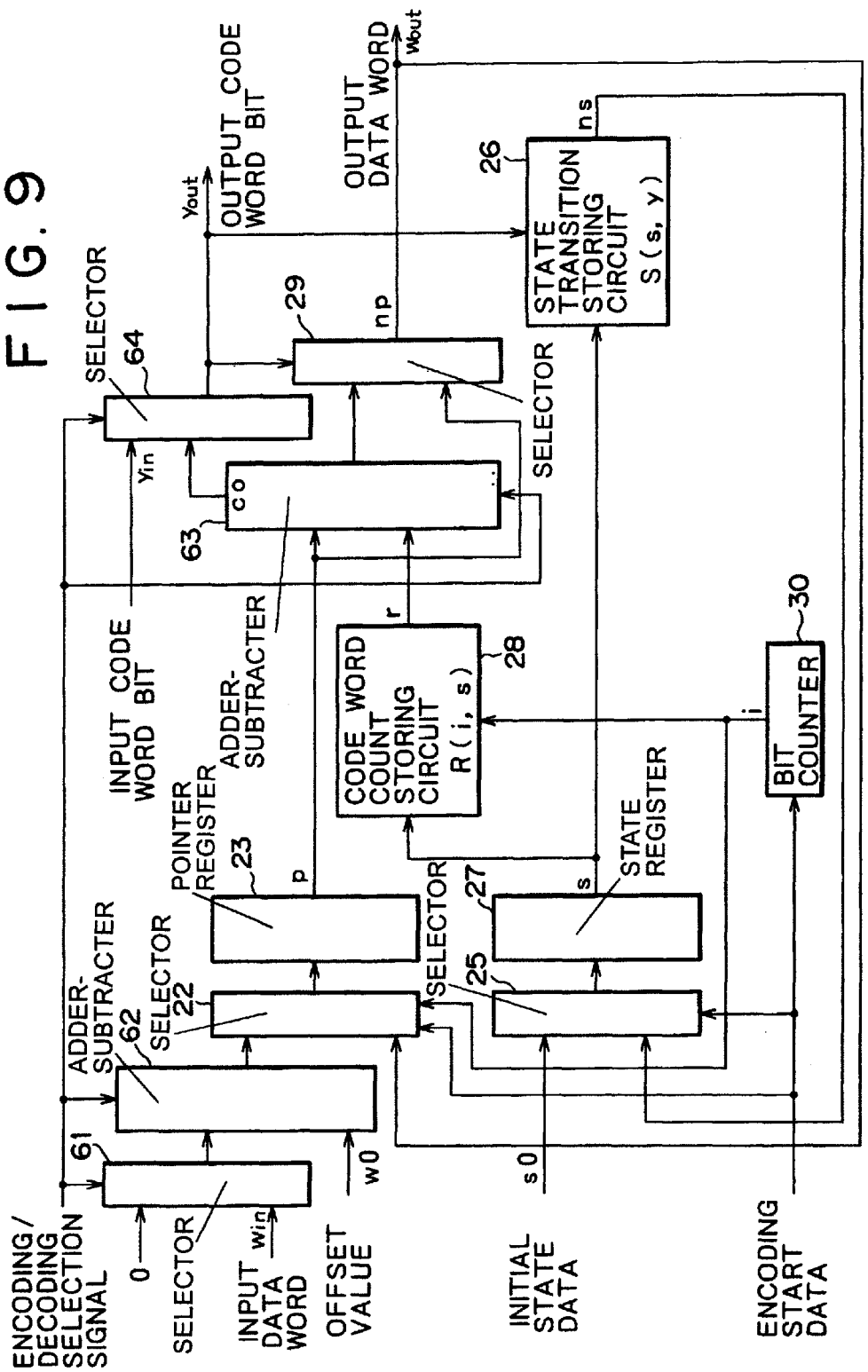
FIG. 9 is a block diagram showing a configuration of an encoding-decoding circuit.

In comparison between FIGS. 3 and 7, the decoder 10 shown in FIG. 7 has no apparatus equivalent to the adder 21 and is provided with the adder 44 in place of the subtracter 24. Except for these points, the configuration is exactly the same. Accordingly, for an apparatus incapable of concurrent execution of encoding and decoding, by integrating the adder and the subtracter into a circuit that allows both encoding and decoding, the circuit size can be further reduced. FIG. 9 is a block diagram showing a configuration of an encoder-decoder. FIG. 9 shows differences between the encoder 1 shown in FIG. 3 and the decoder shown in FIG. 7. Herein will be described differences with the encoder 1 shown in FIG. 3.

In the encoder-decoder, an adder-subtracter 62 and an adder-subtracter 63 are provided in place of the adder 21 and the subtracter 24, respectively, and a selector 61 and a selector 64 are added. In this configuration example, a data word to be encoded is inputted to the adder-subtracter 62 via the selector 61 and supplied to a selector 22. A code word bit to be decoded is inputted to a selector 29 via a selector 64. The selector 61, adder-subtracter 62, adder-subtracter 63, and selector 64 are operationally controlled by an encoding/decoding selection signal.

It will be understood from the above that the encoder 1 and the decoder 10 of this embodiment have no significant difference in terms of circuit size between when shared as shown in FIG. 9 and when separated from each other.

Figure 10:
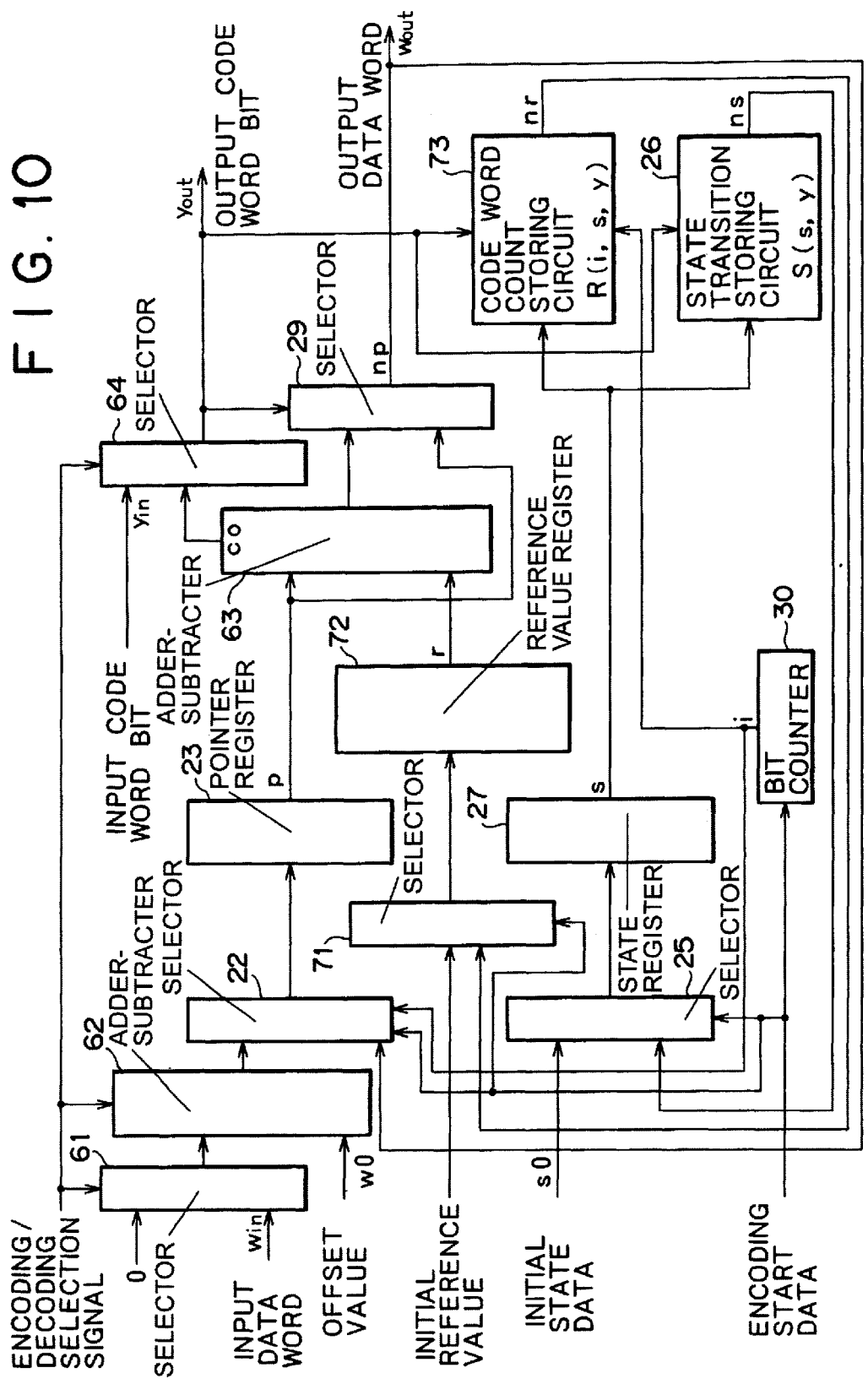
FIG. 10 is a block diagram showing another configuration of the encoding-decoding circuit.

FIG. 10 is a block diagram showing a configuration of another encoding-decoding circuit. An encoding-decoding circuit of this configuration example and the encoding-decoding circuit shown in FIG. 9 are different in that, in the configuration example of FIG. 10, a selector 71 and a reference value register 72 are added to the encoding-decoding circuit of the configuration example of FIG. 9. For this reason, data of an initial reference value is inputted to the selector 71, and encoding start data and data outputted from the code word count storing circuit 28 are also inputted. Data outputted from the selector 71 is inputted to the adder-subtracter 63 via the reference value register 72.

In the configuration example of FIG. 9, a reference value r outputted from the code word count storing circuit 28 is represented by a function of the output i of the bit counter 30 and a current state s, while, in the configuration example of FIG. 10, a reference value r outputted from the code word count storing circuit 73 is represented by a function of the i and s, and further a code word bit y.

Such a configuration helps to increase processing speed. To be more specific, processing speed is increased because a reference value nr at the next time is obtained based on a current time r, a current state s, and a current code word bit y.

Furthermore, there is an idea of a critical path to determine a maximum operating speed of a circuit. The critical path refers to a path having the largest propagation delay of paths from the output of a register to the input. In the encoding-decoding circuit shown in FIG. 10, some paths can be a critical path. For example, there is a path beginning from the reference value register 72 and returning to the reference value register 72 via the adder-subtracter 63, selector 64, code word count storing circuit 73, and selector 71.

On the other hand, a critical path in the encoding-decoding circuit shown in FIG. 9 is a path beginning from the state register 27 returning to the state register 27 via the code word count storing circuit 28, adder-subtracter 63, selector 64, state transition storing circuit 26, and selector 25. Accordingly, the encoding-decoding circuit shown in FIG. 10 has a shorter critical path, providing a higher maximum operation speed.

Figure 12:
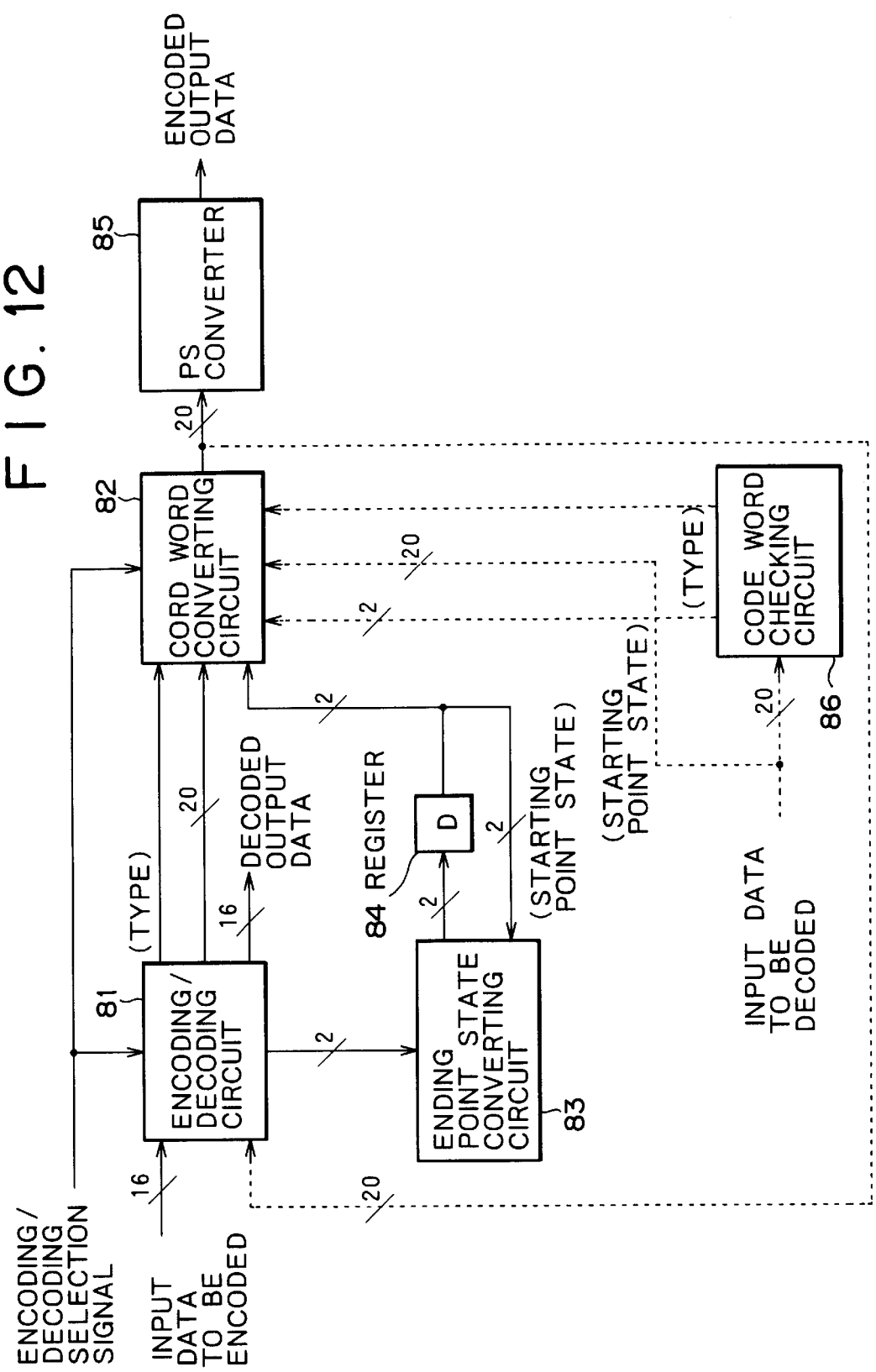
FIG. 12 is a block diagram showing yet another configuration of the encoding-decoding circuit.
Figure 13:
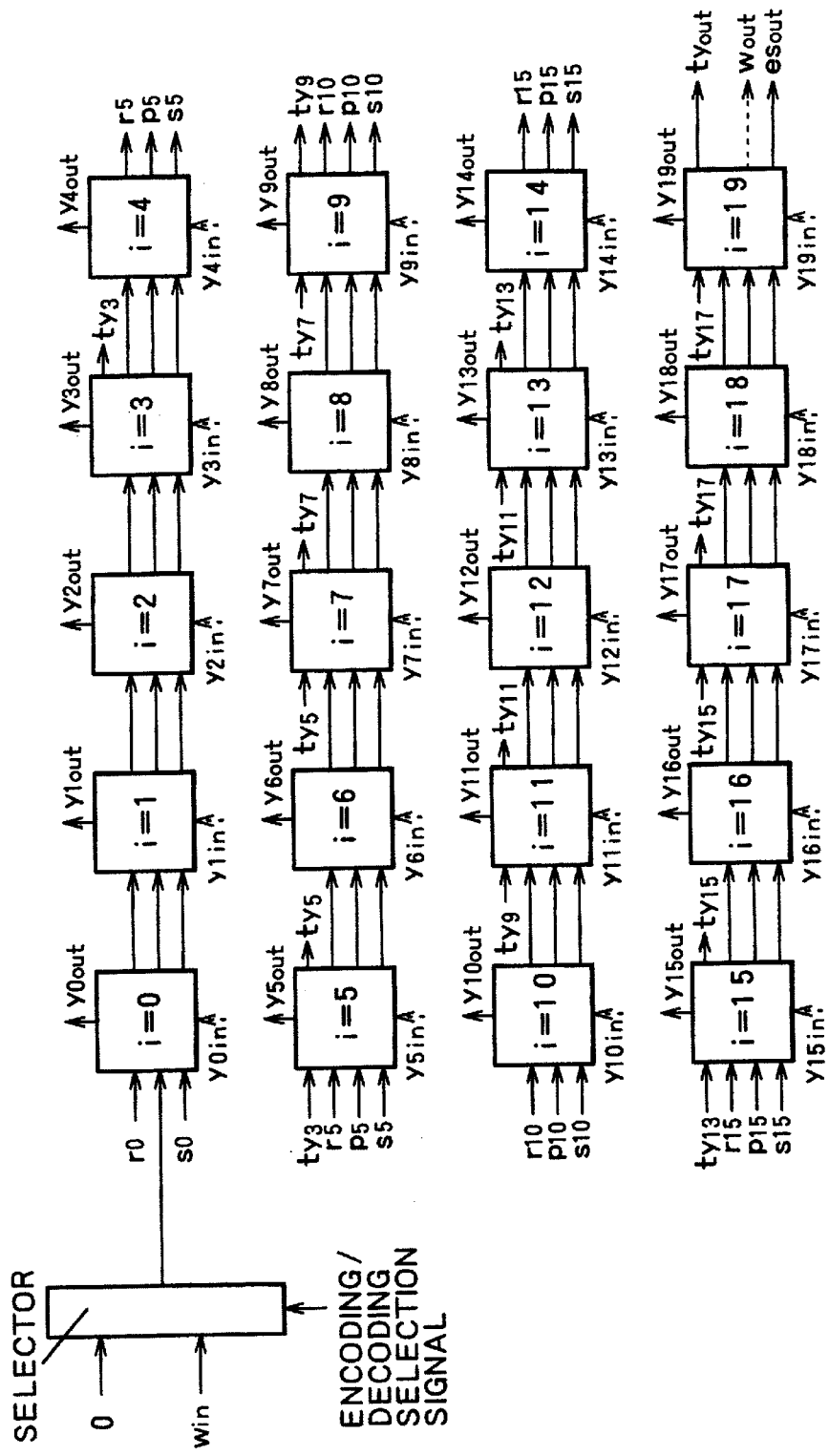
FIG. 13 is a block diagram showing a configuration of an encoding-decoding circuit 81.
Figure 14:
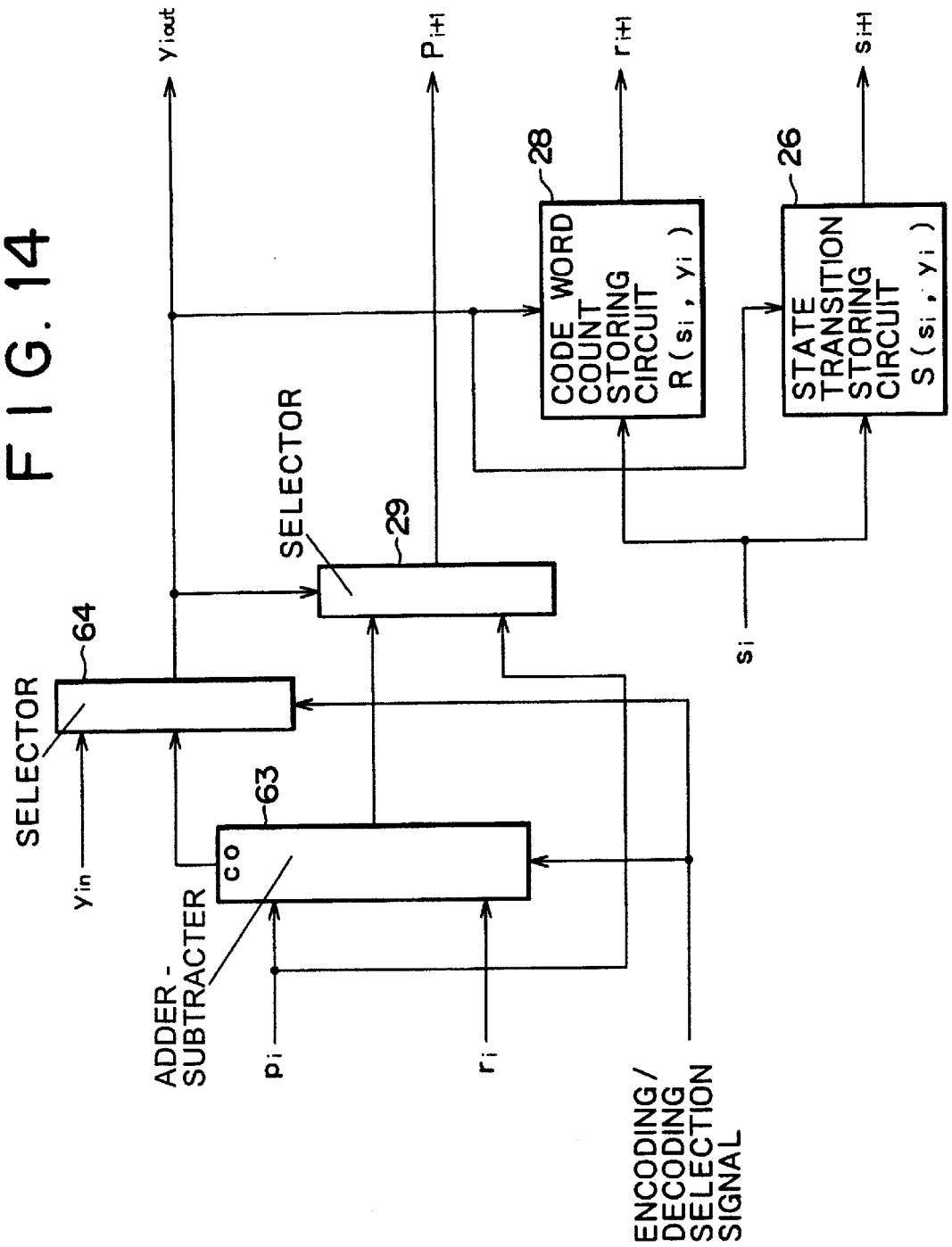
FIG. 14 is a block diagram showing a detailed configuration of the encoding-decoding circuit 81.
Figure 16A:
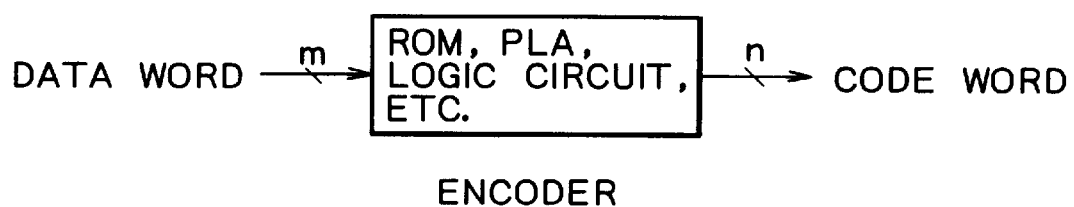
FIG. 16 is a block diagram showing a configuration of a conventional encoder and decoder.
Figure 16B:
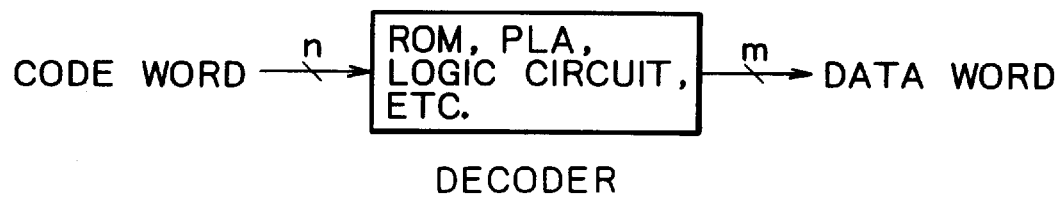

FIG. 11 is a table showing part of data stored in the code word count storing circuit 73. FIG. 12 shows a configuration of another encoding-decoding circuit, FIG. 13 shows a configuration of an encoding-decoding circuit 81, and FIG. 14 shows an internal configuration of modules shown in FIG. 13. In the encoding-decoding circuit shown in FIG. 12, a data length is 16 bits and a code length is 20 bits, and to clarify the difference of data flows between encoding and decoding, a data flow of encoding is represented by a solid line, and a data flow of decoding by a dashed line. Data to be encoded is inputted to the encoding-decoding circuit 81. The encoding-decoding circuit 81 inputs the data to a code word converting circuit 82 and an ending point state converting circuit 83. The ending point state converting circuit 83 outputs the data to a register 84. Output from the register 84 is inputted to the code word converting circuit 82 and the ending point state converting circuit 83. Output from the code word converting circuit 82 is inputted to an PS converter 85.

Data to be decoded is inputted to a code word checking circuit 86 and the code word converting circuit 82. Data outputted from the code word checking circuit is inputted to the code word converting circuit 82. Data outputted from the code word converting circuit 82 is inputted to the encoding-decoding circuit 81, where decoding is performed and decoded data is outputted.

Next, the operation of the encoding process will be described. 16-bit data inputted to the encoding-decoding apparatus is converted by the encoding-decoding circuit 81 into a code word with a state (3, 3) on the finite-state transition diagram shown in FIG. 2 as a starting point. At the same time, the state and type of the converted code word are outputted from the encoding-decoding circuit 81. The state and type of an ending point are obtained taking advantage of the fact that state transition is followed in the process of encoding. $ty_{out}$ in FIG. 13 is the type of the code word and $ty_3$ to $ty_{17}$ are signals in the process of generation of $ty_{out}$.

In FIG. 13, tyi outputted from the modules indicated by i of an odd number is the result of a logical add of a signal determined as true if RDS of a $state_{i+1}$ outputted from the state transition storing circuit 26 in FIG. 14 is 7, and $ty_{i-2}$, and can be easily generated. The state es with a code word as an ending point is the output $s_{i+1}$ itself of the state transition storing circuit 26 of a module indicated by i of 19. Details of FIGS. 13 and 14 will be given later. The state of an ending point outputted from the encoding-decoding circuit 81 is converted into a state with a code word outputted from the code word converting circuit 82 as a starting point by the ending point state converting circuit 83 and the register 84. The code word outputted from the code word converting circuit is converted into a code word with a state outputted from the register 84 as a starting point, based on the type of a code word outputted from the encoding-decoding circuit 81. The code word outputted from the code word converting circuit 82 is converted into serial data by a PS converter 85 and the serial data is outputted from the encoding-decoding apparatus.

Next, the flow of the decoding process will be described. An inputted 20-bit code word is checked as to the state and type of the starting point by the code word checking circuit 86. On the other hand, the inputted code word, in the code word converting circuit 82, is converted into a code word with the state (3, 3) as a starting point, based on the state and type of a starting point outputted from the code word checking circuit 86. The converted code word is inputted to the encoding-decoding circuit 81 and decoded into a 16-bit data word.

In the encoding-decoding apparatus shown in FIG. 12, since encoding and decoding are performed for only code words with a state (a state (3, 3) in this embodiment) on a finite-state transition diagram as a starting point, a state as an ending point in a previous code word and a state as a starting point in a current code word need not be brought into agreement. Accordingly, the encoding-decoding circuit 81 can be configured as shown in FIG. 13 and the circuit of the modules can be configured as shown in FIG. 14.

FIG. 14 shows a module for encoding and decoding one bit of code word, which is configured with the selectors 22, 25, 61, and 71, the status register 27, adder-subtracter 62, pointer register 23, reference value register 72, and bit counter 30, required for initialization, removed from the circuit shown in FIG. 10. By the way, the selector 61 is shown in FIG. 13. The encoding-decoding circuit 81 shown in FIG. 13 is configured with 20 modules having no register for processing one bit of code word which are serially connected. In the circuit configuration shown in FIG. 10, a pointer p, reference value r, and state s form a loop with registers intervening among them, and a critical path within the loop determined a maximum operating speed of the circuit. Accordingly, the circuit could not be operated at a cycle shorter than a propagation delay amount of the critical path.

On the other hand, in the circuit configuration shown in FIG. 13, since no loop exists and pipeline processing can be performed, basically, the circuit is freed from the limitation of maximum operation speed. The pipeline processing midway cuts a combination circuit from input to output by a register to shorten a critical path itself. For example, in FIG. 13, suppose propagation speeds of the modules is equal and a register is inserted in the boundary of the tenth and eleventh modules from input. The critical path will be divided to two parts and propagation delay will be halved, doubling the maximum operating speed of the circuit in comparison with before the insertion. With an increase of register insertion locations, the maximum operating speed can be further increased.

In the encoding or decoding performed by the above described encoding-decoding circuit 81, not all 124,416 20-bit code word candidates with the state (3, 3) on the finite-state transition diagram shown in FIG. 2 as a starting point are used actual code words. This means that, when code word c andidates are sorted in ascending order or descending order, code word candidates unusable as code words are interspersed.

In the encoding process performed by the encoder 1 of FIG. 3 and the decoding process performed by the decoder 10 of FIG. 7, a reference value r is uniquely determined from a current time i and a current state s, whereas, when actually usable code words are interspersed as described above, there may arise the case where reference values r differ if the current state is unchanged but previous state transitions are different. This means that the current state is divided to a plurality of states by previous state transitions, and different reference values r occur for each of the states. Accordingly, a finite-state transition diagram is newly produced by performing state division for that of FIG. 2, and processing must be performed based on it.

Here is a list of restrictions on code words with the state (3, 3) of the embodiment as a starting point.
1. The maximum amplitudes of ADS and RDS of a code sequence are both 10.
2. An ending point of code words on FIG. 2 is one of the states (3, 3), (3, 7), (7, 3), and (7, 7).
3. When the time of a starting point is 0 and the time of an ending point is 20, code words, on FIG. 2, must not pass both the state in which ADS is 0 at time 7 and the state in which ADS is 2 at time 7.
4. On FIG. 2, code words must not pass through the state in which RDS is 0 at time 3. Code words must not pass through the state in which RDS is 10 at time 7. Code words having RDS of 0 at time 6 and code words having RDS of 0 at time 7 must not pass through the state in which RDS is 7, at any of the times.
5. On FIG. 2, code words having ADS of 3 at time 6 and ADS of 4 at time 7 must not pass through the state in which RDS is 7, at both time 6 and time 7.
6. On FIG. 2, code words having RDS of 6 at time 3 must pass through the state in which RDS is 7, at some point in time.
7. On FIG. 2, code words having RDS of 1 at time 2, RDS of 2 at time 3, and RDS of 1 at time 4 must not pass through the state in which RDS is 7, at any of the times. Code words having RDS of 1 at time 4, RDS of 2 at time 6, and RDS of 1 at time 6 must not pass through the state in which RDS is 7, at any of the times. Code words having RDS of 1 at time 6, RDS of 2 at time 7, and RDS of 1 at time 8 must not pass through the state in which RDS is 7, at any of the times.
8. On FIG. 2, code words must not have RDS of 4 at time 13, RDS of 5 at time 14, RDS of 4 at time 16, RDS of 6 at time 16, RDS of 6 at time 17, RDS of 6 at time 18, RDS of 4 at time 19, and RDS of 3 at time 20. Code words must not have RDS of 6 at time 13, RDS of 6 at time 14, RDS of 6 at time 15, RDS of 6 at time 16, RDS of 4 at time 17, RDS of 6 at time 18, RDS of 6 at time 19, and RDS of 7 at time 20.
9. On FIG. 2, code words must not have RDS of 2 at time 13, RDS of 1 at time 14, RDS of 2 at time 16, RDS of 1 at time 16, RDS of 0 at time 17, RDS of 1 at time 18, RDS of 2 at time 19, and RDS of 3 at time 20. Code words must not have RDS of 4 at time 13, RDS of 5 at time 14, RDS of 6 at time 15, RDS of 6 at time 16, RDS of 4 at time 17, RDS of 5 at time 18, RDS of 4 at time 19, and RDS of 3 at time 20. Code words must not have RDS of 6 at time 13, RDS of 6 at time 14, RDS of 4 at time 16, RDS of 6 at time 16, RDS of 6 at time 17, RDS of 5 at time 18, RDS of 6 at time 19, and RDS of 7 at time 20.

FIG. 15 shows contents stored in the code word count storing circuit 28 and the state transition storing circuit 26 in FIG. 14 in a module indicated by i of 11 on FIG. 13 when the above described restrictions 1 to 9 are added. The states are represented by (ADS, RDS, divided state number).

By encoding data words by use of a finite-state transition diagram in this way, an encoding or decoding apparatus can be reduced in size and processing time can be shortened.

In this specification, media for distributing a computer program for executing the above processing to users include transmission media by networks such as Internet and digital satellites, in addition to magnetic disk, CD-ROM, and other information recording media.

As described above, according to an encoding apparatus set forth in claim 1, an encoding method set forth in claim 6, and distribution media set forth in claim 7, state transition s on a finite-state transition diagram, corresponding to a code is set; a reference value r is set by use of the set state transition s; a pointer p indicating what data word w of the data is being processed is set; when the pointer p is greater than or equal to the reference value r, the symbol of a code word bit y is set to either of 1 and 0, the value of the pointer p is set to (p−r) and outputted; and when the pointer p is smaller than the reference value r, the symbol of the code word bit y is set to the other of 1 and 0 and the value of the pointer p is outputted without being updated. As a result, the encoding apparatus can be constructionally reduced and can perform processing at a high speed.

According to a decoding apparatus as set forth in claim 8, a decoding method according to claim 12, and a distribution media set forth in claim 13, state transition s on a finite-state transition diagram, corresponding to a code is set; n is counted as one cycle; a reference value r is set by use of the set state transition s and a counted counter value i; a pointer p indicating the minimum value of the range of data to be processed is set; when the symbol of the code word bit y is either of 0 and 1, the value of the pointer p is updated to (p+r) and outputted; when the symbol of the code word bit y is the other of 0 and 1, the pointer p is outputted without being updated; it is judged whether a counter value i is equal to (n−1); and when it is judged that the counter value i is equal to (n−1), the pointer p is determined as a data word w. As a result, the decoding apparatus can be constructionally reduced and can perform processing at a high speed.

What is claimed is:

1. An encoding apparatus for encoding m-bit data arranged in a predetermined sequence while maintaining correspondence with n-bit codes arranged in a predetermined sequence, said encoding apparatus comprising:

first setting means for setting state transition s on a finite-state transition diagram, corresponding to a code;

second setting means for setting a reference value r by use of the state transition s set by said first setting means;

third setting means for setting a pointer p indicating what data word w of said data is being processed;

comparison means for comparing the reference value r set by said second setting means and the value of the pointer p set by said third setting means; and output means, when it is judged by said comparison means that the pointer p is greater than or equal to the reference value r, for setting the symbol of a code word bit y to either of 1 and 0 and updating the value of the pointer p to (p−r) and outputting it, and when it is judged that the pointer p is smaller than the reference value r, setting the symbol of the code word bit y to the other of 1 and 0 and outputting the value of the pointer p without updating it.

2. An encoding apparatus according to claim 1, wherein, if said predetermined sequence is ascending order by value, one of the symbols of said code word y is set to 1 and the other is set to 0, and if descending order, one of the symbols of said code word y is set to 0 and the other is set to 1.

3. An encoding apparatus according to claim 1, further comprising counting means for counting said n as one cycle;

wherein said second setting means also uses a counter value i outputted from said counting means to set said reference value r.

4. An encoding apparatus according to claim 1, wherein said finite-state transition diagram is a transition diagram representing ADS and RDS restrictions which a code sequence is subject to.

5. An encoding apparatus according to claim 1, wherein, when the total number of code word candidates with each element, contained in a collection of states with an n-bit code as a starting point, as a starting point, and an element, contained in a collection of states with an n-bit code as an ending point, as an ending point, is larger than the total number of all m-bit data words with respect to each starting point, the pointer p set by said third setting means is set by using a value greater than or equal to a value, as an offset value, resulting from subtracting the total number of data words from the minimum value of the total number of code word candidates.

6. An encoding method of an encoding apparatus for encoding m-bit data arranged in a predetermined sequence while maintaining correspondence with n-bit codes arranged in a predetermined sequence, said encoding method comprising:

a first setting step for setting state transition s on a finite-state transition diagram, corresponding to a code;

a second setting step for setting a reference value r by use of the state transition s set by said first setting step;

a third setting step for setting a pointer p indicating what data word w of said data is being processed;

a comparison step for comparing the reference value r set by said second setting step and the value of the pointer p set by said third setting step; and an output step, when it is judged by said comparison step that the pointer p is greater than or equal to the reference value r, for setting the symbol of a code word bit y to either of 1 and 0 and updating the value of the pointer p to (p−r) and outputting it, and when it is judged that the pointer p is smaller than the reference value r, setting the symbol of the code word bit y to the other of 1 and 0 and outputting the value of the pointer p without updating it.

7. A distribution media for distributing a computer-readable program for having an encoding apparatus for encoding m-bit data arranged in a predetermined sequence while maintaining correspondence with n-bit codes arranged in a predetermined sequence, perform a process comprising:

a first setting step for setting state transition s on a finite-state transition diagram, corresponding to a code;

a second setting step for setting a reference value r by use of the state transition s set by said first setting step;

a third setting step for setting a pointer p indicating what data word w of said data is being processed;

a comparison step for comparing the reference value r set by said second setting step and the value of the pointer p set by said third setting step; and an output step, when it is judged by said comparison step that the pointer p is greater than or equal to the reference value r, for setting the symbol of a code word bit y to either of 1 and 0 and updating the value of the pointer p to (p−r) and outputting it, and when it is judged that the pointer p is smaller than the reference value r, setting the symbol of the code word bit y to the other of 1 and 0 and outputting the value of the pointer p without updating it.

8. A decoding apparatus for decoding n-bit codes arranged in a predetermined sequence while maintaining correspondence with m-bit data arranged in a predetermined sequence, comprising:

first setting means for setting state transition s on a finite-state transition diagram, corresponding to a code;

counting means for counting said n as one cycle;

second setting means for setting a reference value r by use of the state transition s set by said first setting means and a counter value i outputted from said counting means;

third setting means for setting a pointer p indicating the minimum value of the range of said data to be processed;

judgment means for judging the symbol of a code word bit y;

output means, when it is judged by said judgment means that the symbol of the code word bit y is either of 0 and 1, for updating the value of the pointer p to (p+r) and outputting it, and when it is judged that the symbol of the code word bit y is the other of 0 and 1, outputting the pointer p without updating it; and determination means for judging whether a counter value i outputted from said counter means is equal to (n−1), and when it is judged that said counter value i is equal to (n−1), determining the pointer p outputted from said output means as said data word w.

9. A decoding apparatus according to claim 8, wherein, if said predetermined sequence is ascending order by value, one of the symbols of said code word y is set to 0 and the other is set to 0, and if descending order, one of the symbols of said code word y is set to 1 and the other is set to 1.

10. A decoding apparatus according to claim 8, wherein said finite-state transition diagram is a transition diagram representing ADS and RDS restrictions which a code sequence is subject to.

11. A decoding apparatus according to claim 8, wherein, when the total number of code word candidates with each element, contained in a collection of states with an n-bit code as a starting point, as a starting point, and an element, contained in a collection of states with an n-bit code as an ending point, as an ending point, is larger than the total number of all m-bit data words with respect to each starting point, the pointer p set by said third setting means is set by using a value greater than or equal to a value, as an offset value, resulting from subtracting the total number of data words from the minimum value of the total number of code word candidates.

12. A decoding method of a decoding apparatus for decoding n-bit codes arranged in a predetermined sequence while maintaining correspondence with m-bit data arranged in a predetermined sequence, the decoding method comprising:

a first setting step for setting state transition s on a finite-state transition diagram, corresponding to a code;

a counting step for counting said n as one cycle;

a second setting step for setting a reference value r by use of the state transition s set by said first setting step and a counter value i outputted from said counting step;

a third setting step for setting a pointer p indicating the minimum value of the range of said data to be processed;

a judgment step for judging the symbol of a code word bit y;

an output step, when it is judged by said judgment step that the symbol of the code word bit y is either of 0 and 1, for updating the value of said pointer p to (p+r) and outputting it, and when it is judged that the symbol of the code word bit y is the other of 0 and 1, outputting said pointer p without updating it; and a determination step for judging whether a counter value i outputted from said counting step is equal to (n−1), and when it is judged that said counter value i is equal to (n−1), determining the pointer p outputted from said output step as said word w.

13. A distribution media for distributing a computer-readable program for having a decoding apparatus for decoding n-bit codes arranged in a predetermined sequence while maintaining correspondence with m-bit data arranged in a predetermined sequence, perform a process comprising:

a first setting step for setting state transition s on a finite-state transition diagram, corresponding to a code;

a counting step for counting said n as one cycle;

a second setting step for setting a reference value r by use of the state transition s set by said first setting step and a counter value i outputted from said counting step;

a third setting step for setting a pointer p indicating the minimum value of the range of said data to be processed;

a judgment step for judging the symbol of a code word bit y;

an output step, when it is judged by said judgment step that the symbol of the code word bit y is either of 0 and 1, for updating the value of said pointer p to (p+r) and outputting it, and when it is judged that the symbol of the code word bit y is the other of 0 and 1, outputting said pointer p without updating it; and a determination step for judging whether a counter value i outputted from said counting step is equal to (n−1), and when it is judged that said counter value i is equal to (n−1), determining the pointer p outputted from said output step as said word w.

* * * * *